United States Patent
Nishiyama et al.

(10) Patent No.: US 7,596,010 B2
(45) Date of Patent: Sep. 29, 2009

(54) SEMICONDUCTOR MEMORY DEVICE

(75) Inventors: Masahiko Nishiyama, Ome (JP); Keiichi Higeta, Hamura (JP); Takashi Koba, Kodaira (JP)

(73) Assignees: Hitachi, Ltd., Tokyo (JP); Hitachi ULSI Systems Co., Ltd., Kodaira-shi (JP)

( * ) Notice: Subject to any disclaimer, the term of this patent is extended or adjusted under 35 U.S.C. 154(b) by 0 days.

(21) Appl. No.: 12/030,126

(22) Filed: Feb. 12, 2008

(65) Prior Publication Data

US 2008/0144345 A1 Jun. 19, 2008

Related U.S. Application Data

(62) Division of application No. 11/711,816, filed on Feb. 28, 2007, now Pat. No. 7,349,231, which is a division of application No. 11/020,136, filed on Dec. 27, 2004, now Pat. No. 7,203,081.

(30) Foreign Application Priority Data

Jan. 13, 2004 (JP) .............................. 2004-005308
Sep. 13, 2004 (JP) .............................. 2004-265297

(51) Int. Cl.
*G11C 15/00* (2006.01)
(52) U.S. Cl. .................................. 365/49.17; 365/49.1
(58) Field of Classification Search ............... 365/49.17
See application file for complete search history.

(56) References Cited

U.S. PATENT DOCUMENTS

| | | | |
|---|---|---|---|
| 5,930,359 A | 7/1999 | Kempke et al. | |
| 6,154,384 A | 11/2000 | Nataraj et al. | |
| 6,191,969 B1 | 2/2001 | Pereira | |
| 6,240,000 B1 | 5/2001 | Sywyk et al. | |
| 6,242,280 B1 | 6/2001 | Koay et al. | |
| 6,275,426 B1 | 8/2001 | Srinivasan et al. | |
| 6,477,071 B1 | 11/2002 | Edman et al. | |
| 6,661,686 B1 | 12/2003 | Srinivasan | |
| 6,876,560 B2 | 4/2005 | Sugahara et al. | |
| 6,922,751 B2 * | 7/2005 | Regev et al. | 711/108 |
| 6,958,925 B1 | 10/2005 | Om et al. | |
| 7,124,268 B2 * | 10/2006 | Abdat | 711/165 |
| 2004/0001380 A1 | 1/2004 | Becca et al. | |
| 2004/0042241 A1 | 3/2004 | McKenzie et al. | |

OTHER PUBLICATIONS

Noda et al., "A 143MHz 1.1W 4.5Mb Dynamic TCAM with Hierarchical Searching and Shift Redundancy Architecture", *2004 IEEE International Solid State Circuits Conference*, Session 11, pp. 208-209 and 522-523.

* cited by examiner

*Primary Examiner*—Tan T. Nguyen
(74) *Attorney, Agent, or Firm*—Miles & Stockbridge P.C.

(57) ABSTRACT

There is provided a control circuit (409) for fetching a result of a comparison of a part of bits of entry data with a corresponding bit of comparison data and prohibiting a comparison of residual bits in the entry data with the corresponding bit of the comparison data when the result of the comparison is mismatched, and the comparison of the residual bits in the entry data with the corresponding bit of the comparison data is prohibited. Consequently, the number of signal lines to be activated in one cycle of a comparing operation is decreased. Thus, a reduction in a consumed power can be achieved.

10 Claims, 27 Drawing Sheets

FIG. 13

| R[0:3] | CD_SE | TG | Q[0:3] |
|---|---|---|---|
| X | 0 | 0 | R[0:3] |
| X | 1 | 1 | R[0:3] |
| '1111' | 1 | 0 | R[0:3] |
| OTHER THAN '1111' | 1 | 0 | R[0:3]+1 |
| '0000' | 0 | 1 | R[0:3] |
| OTHER THAN '0000' | 0 | 1 | R[0:3]−1 |

X : DON'T CARE

US 7,596,010 B2

SEMICONDUCTOR MEMORY DEVICE

CROSS-REFERENCE TO RELATED APPLICATION

This application is a division of application Ser. No. 11/711,816 filed Feb. 28, 2007, now U.S. Pat. No. 7,349,231 which is a division of application Ser. No. 11/020,136 filed Dec. 27, 2004 (now U.S. Pat. No. 7,203,081).

CLAIM OF PRIORITY

The present application claims priority from Japanese application JP 2004-005308 filed on Jan. 13, 2004, and Japanese application JP2004-265297 filed on Sep. 13, 2004, the content of which is hereby incorporated by reference into this application.

FIELD OF THE INVENTION

The present invention relates to a semiconductor memory device, and furthermore, to a technique for reducing a consumed power and a fluctuation in a consumed current and to a technique which is effectively applied to a CAM (Content Addressable Memory), for example.

BACKGROUND OF THE INVENTION

A CAM has been known as a memory to be used in a router for relaying a packet between different network addresses and selecting a direction in an internet communication network. As an example of the CAM, there has been known a memory of a ternary type which serves to store the 2-bit information of a data comparison mask in a memory cell and to output the result of a comparison with input data to a comparison match line (for example, see Patent Document 1).

In an LSI for a CAM which compares data having a large capacity, hundreds to thousands of CAM macro cells of approximately 64 entries by 72 bits are provided, for example, and a search table of several k entries is constituted wholly. The CAM macro cell uses, as a mainstream, a method of precharging a match signal line and activating a comparison data line when comparing data for a comparison with the internal data of a memory cell, and discharging the electric charge of the match signal line even if one bit is mismatched. As a whole, a very small number of data are matched and most of data are mismatched. For this reason, in the case in which data in all entries on a chip are compared with each other, the charge/discharge of the electric charges of the comparison data line and the match signal line is repeated every cycle because most of the data are mismatched. As a countermeasure, for example, there has been proposed a method of dividing comparison data into a plurality of portions and comparing them (for example, Patent Document 2). According to this method, a second comparing match signal line is precharged only when the divided data are matched with each other and the precharging is not carried out when they are mismatched based on the result of a first comparison for the divided data. Thus, the number of the charging/discharging operations of the match signal line is decreased and an operating current is reduced.

Moreover, there has been known a technique for cascade connecting a plurality of CAM chips to increase the number of entries when using the respective CAM chips as a system (for example, Patent Documents 3 to 5 and Non-Patent Document 1).

Patent Document 1: U.S. Pat. No. 6,154,384 Specification
Patent Document 2: U.S. Pat. No. 6,242,280 Specification
Patent Document 3: U.S. Pat. No. 5,930,359 Specification
Patent Document 4: US Patent Application Laid-Open No. 2004/0001380 Specification
Patent Document 5 US Patent Application Laid-Open No. 2004/0042241A1 Specification
Non-Patent Document 1 ISSCC 2004/Session 11/DRAM/ 11.5, "A 143 MHz 1.1W4.5 Mb Dynamic TCAM with Hierarchical Searching and Shift Redundancy Architecture", 2004 IEEE ISSCC pp. 208-209, 522-523

SUMMARY OF THE INVENTION

The inventor of the application investigated the operating current of an LSI for a CAM. Consequently, the charge/ discharge of the electric charges of a match signal line and a comparison data line is dominant, and the operating current is greatly increased with an increase in a speed and integration. According to the technique described in the Patent Document 2, the charging/discharging current of a match signal line can be reduced and a comparison data line is operated every cycle. For this reason, a reduction in the charging/discharging current cannot be expected. Moreover, the operating current of a CAM portion is proportional to a search rate and the current of the LSI greatly fluctuates when the search rate is changed. Therefore, a supply voltage fluctuates so that the malfunction of a circuit might be caused. The change of the search rate is caused when the degree of congestion of a network fluctuates or a search is temporarily stopped in order to change the data of the CAM portion in the case in which the CAM portion is used for a communication.

A CAM macro cell is conventionally suitable for a use in a router to select a path on a net and to carry out the filing of transmitted data. In such a use, conventionally, the bit width of data is comparatively small. Also in the conventional technologies such as the Patent Documents 1 to 5 and the Non-Patent Document 1, therefore, there have not been sufficiently considered an enhancement in a throughput in the layout technique of the CAM macro cell and a technique for reducing a consumed power. In recent years, however, an increase in a bit width to 576 bits in an IPV6 protocol is greatly required as in a CAM for a router, for example, and the amount of information to be transmitted also tends to be increased. For this reason, it is particularly necessary to enhance the throughput by the layout technique of the CAM portion and to reduce the consumed power.

It is an object of the invention to provide a technique for reducing a consumed power.

It is another object of the invention to provide a technique for reducing a fluctuation in a consumed current.

It is a further object of the invention to provide a technique for enhancing the throughput of a CAM portion.

The above and other objects and novel features of the invention will be apparent from the description of this specification and the accompanying drawings.

The summary of the typical invention disclosed in the invention will be briefly described below.

More specifically, a semiconductor memory device which includes a CAM portion capable of holding entry data and can compare input comparison data with the entry data and can output a result of the comparison, comprises a control circuit for fetching a result of a comparison of a part of bits of the entry data with a corresponding bit of the comparison data and prohibiting a comparison of residual bits in the entry data with the corresponding bit of the comparison data when the result of the comparison is mismatched.

According to the means described above, the control circuit fetches the result of the comparison of the part of the bits of the entry data with the corresponding bit of the comparison data, and prohibits the comparison of the residual bits in the entry data with the corresponding bit of the comparison data when the result of the comparison is mismatched. Thus, the comparison of the residual bits in the entry data with the corresponding bit of the comparison data is prohibited. Consequently, it is possible to decrease the number of signal lines to be activated in one cycle of a comparing operation, thereby achieving a reduction in a consumed power.

Moreover, there is provided a control circuit for fetching a result of a comparison of a bit of a former stage portion in the entry data with a corresponding bit of the comparison data and hindering a bit of a latter stage portion in the entry data from being fetched into the CAM portion, there by prohibiting a comparison of the bit of the latter stage portion in the entry data with the corresponding bit of the comparison data when the result of the comparison is mismatched.

According to the means described above, the control circuit fetches the result of the comparison of the bit of the former stage portion in the entry data with the corresponding bit of the comparison data, and hinders the bit of the latter stage portion in the entry data from being fetched into the CAM portion when the result of the comparison is mismatched. Consequently, it is possible to decrease the number of signal lines to be activated in one cycle of a comparing operation, thereby achieving a reduction in a consumed power.

In this case, an operation for comparing the bit of the former stage portion in the entry data with the corresponding bit of the comparison data and an operation for comparing the bit of the latter stage portion in the entry data with the corresponding bit of the comparison data are pipeline operated. Consequently, it is possible to achieve an enhancement in the efficiency of the comparing operation.

In order to further reduce a consumed current, it is preferable to provide a precharge circuit capable of precharging only a match signal line of a latter stage portion in an entry which is matched by the comparison of the bit of the former stage portion in the entry data with the corresponding bit of the comparison data.

In the case in which a first circuit for precharging a match signal line in the latter stage portion every cycle is provided, there is provided a second circuit for discharging the match signal line of the latter stage portion in an entry which is mismatched by the comparison in the former stage portion.

In order to reduce the deviation of a logic in the entry data, it is preferable that even number bits in the entry data should be allocated to the former stage portion in the entry data and odd number bits in the entry data should be allocated to the latter stage portion in the entry data.

It is possible to provide a controller for generating a search request to the CAM portion. The controller can be constituted to include search rate setting means capable of setting a search rate having a level for suppressing a fluctuation in a current.

The search rate setting means can be constituted to include an external terminal for fetching a control signal which can control a search rate of the CAM portion and holding means capable of holding the control signal.

Moreover, a semiconductor memory device which includes a CAM portion capable of holding entry data and can compare input comparison data with the entry data and can output a result of the comparison, comprises a controller for generating a search request to the CAM portion, the controller including search rate setting means capable of setting a search rate having a level for suppressing a fluctuation in a current.

According to the means described above, the search rate setting means can set a search rate having a level for suppressing a fluctuation in a current. By carrying out such setting, a current generated by the search operation can be always caused to flow. Thus, the fluctuation in the current can be suppressed.

In a semiconductor memory device which includes a CAM portion capable of holding entry data, and can compare input comparison data with the entry data and can output a result of the comparison, furthermore, the CAM portion can be divided into a plurality of blocks capable of comparing the comparison data with the entry data respectively, and each of the blocks can be divided into a plurality of subblocks. The subblock can be constituted to include a latch circuit capable of sequentially transmitting the comparison data from a block positioned on one of end sides of the CAM portion toward a block positioned on the other end side of the CAM portion synchronously with a transmitted clock signal, and a control logic for fetching a result of a comparison of a bit of a former stage portion in the entry data with a corresponding bit of the comparison data and prohibiting a comparison of a bit of a latter stage portion in the entry data with the corresponding bit of the comparison data when the result of the comparison is mismatched. If a design for one block is completed, consequently, it is possible to easily increase the number of entries by arranging the design corresponding to a plurality of blocks. In addition, the subblock is provided with the latch circuit capable of sequentially transmitting the comparison data from the block positioned on one of the end sides of the CAM portion toward the block positioned on the other end side of the CAM portion synchronously with the transmitted clock signal. Thus, a pipeline operation between the blocks can be carried out.

There is provided the control logic for fetching the result of the comparison of the bit of the former stage portion in the entry data with the corresponding bit of the comparison data and prohibiting the comparison of the bit of the latter stage portion in the entry data with the corresponding bit of the comparison data when the result of the comparison is mismatched. Consequently, it is possible to decrease the number of the signal-lines to be activated in one cycle of the comparing operation, thereby achieving a reduction in a consumed power.

In this case, an operation for comparing the bit of the former stage portion in the entry data with the corresponding bit of the comparison data and an operation for comparing the bit of the latter stage portion in the entry data with the corresponding bit of the comparison data are pipeline operated synchronously with the clock signal. In other words, the pipeline operation between the blocks and the pipeline operation for comparing the bit of the latter stage portion in the entry data with the corresponding bit of the comparison data are carried out synchronously with the clock signal. Consequently, it is possible to achieve an enhancement in the throughput of the CAM portion.

Moreover, it is possible to provide a plurality of priority encoder portions corresponding to the blocks. The priority encoder portion can be constituted to include a priority encoder for outputting a match signal capable of deciding whether or not match data are present in a corresponding block, a match address signal indicative of an address when data are matched, and a multiple match signal capable of making a decision when a plurality of match data are present from information transmitted from the corresponding block, and an interblock priority control circuit capable of outputting the output signal of the priority encoder to a block in a latter stage.

The interblock priority control circuit can be constituted to include a first OR gate capable of obtaining an OR logic of a match signal transmitted from the priority encoder and a match signal fetched from a block in a former stage and outputting the OR logic to a block in a latter stage, a second OR gate capable of obtaining an OR logic of a multiple match signal transmitted from the priority encoder and a multiple match signal fetched from the block in the former stage and outputting the OR logic to the block in the latter stage, and a selector capable of selectively outputting, to the block in the latter stage, a match address signal transmitted from the priority encoder and a match address signal fetched from the block in the former stage in response to the match signal fetched from the block in the former stage.

The subblock can be constituted to include a first subblock to be synchronized with a rise timing of the clock signal and a second subblock to be synchronized with a fall timing of the clock signal in the pipeline operation.

BRIEF DESCRIPTION OF THE DRAWINGS

FIG. 13 is a truth table in a circuit illustrated in FIG. 3.

DETAILED DESCRIPTION OF THE PREFERRED EMBODIMENTS

Figure 1:
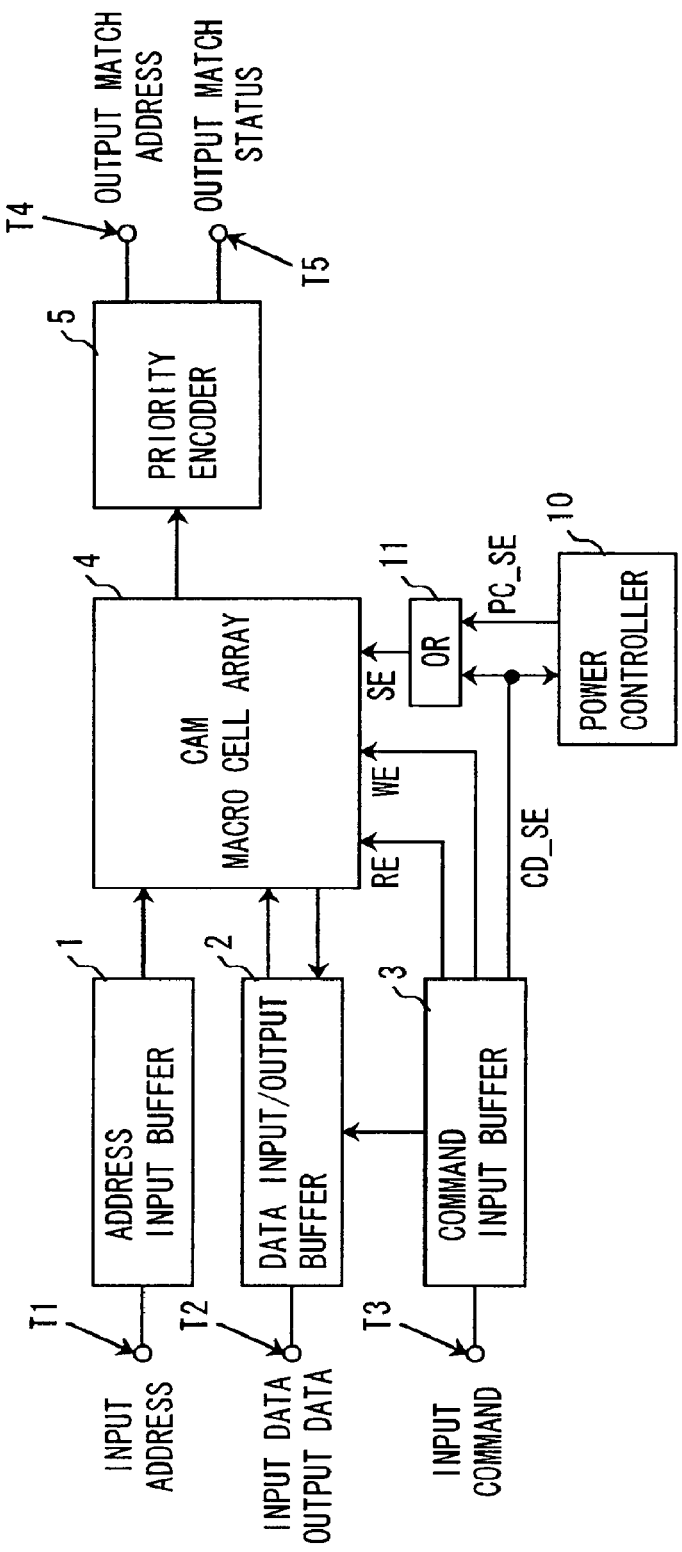
FIG. 1 is a block diagram showing an example of the structure of an LSI for a CAM according to an example of a semiconductor integrated circuit in accordance with the invention.

FIG. 1 shows an LSI for a CAM according to an example of a semiconductor memory device in accordance with the invention.

The LSI for a CAM shown in FIG. 1 is not particularly restricted but comprises an address buffer 1, a data input/output buffer 2, a command buffer 3, a CAM macro cell array 4, a priority encoder 5, a power controller 10 and an OR gate 11, and is formed on a semiconductor substrate such as a monocrystalline silicon substrate by a well-known semiconductor integrated circuit manufacturing technique.

Figure 2:
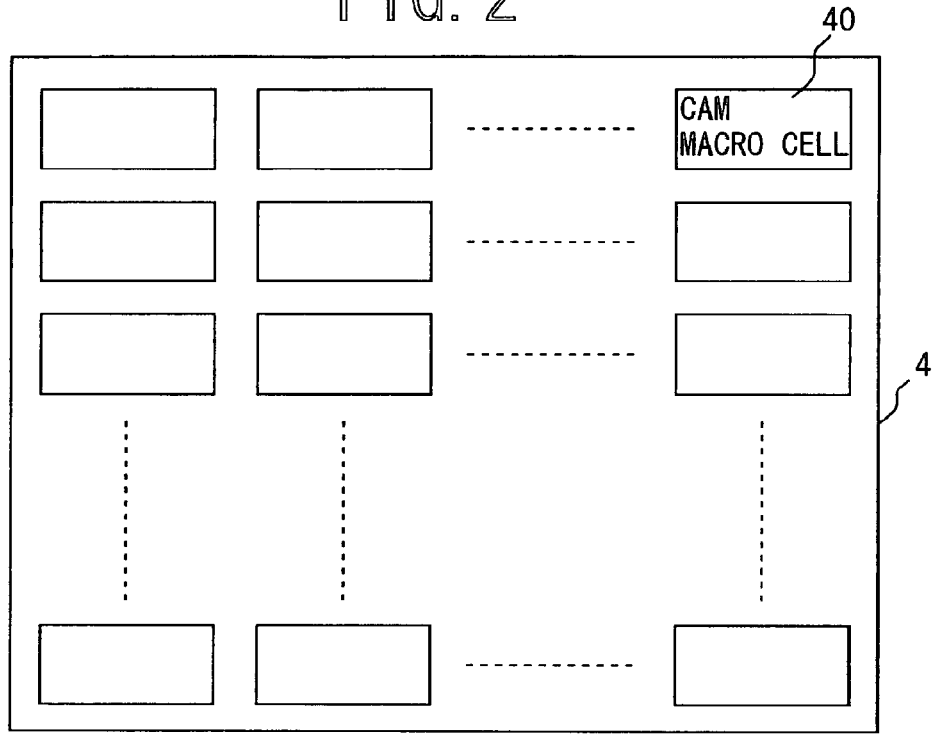
FIG. 2 is a block diagram showing an example of the structure of a CAM macro cell array.

The address buffer 1 has a function of transmitting an address signal input through an address input terminal T1 to the CAM macro cell array 4. The data input/output buffer 2 has a function of transmitting data input through a data input/output terminal T2 to the CAM macro cell array 4 and has a function of outputting data read from the CAM macro cell array 4 through the data input/output terminal T2 to an outside. The command buffer 3 transmits a command input through a command input terminal T3 to the CAM macro cell array 4 and the power controller 10. The command input through the command input terminal T3 includes a read enable signal RE indicative of the validity of a data read from the CAM macro cell array 4, a write enable signal WE indicative of the validity of a data write to the CAM macro cell array 4, and a command search enable signal CD_SE indicative of the validity of a search by a command. The CAM macro cell array 4 is constituted with a plurality of CAM macro cells 40 arranged in an array as shown in FIG. 2, for example. The priority encoder 5 has a function of outputting any of match address outputs and match status outputs from the CAM macro cells 40 in the CAM macro cell array 4 which has a high priority from output terminals T4 and T5 to the outside. The power controller 10 can generate a dummy search request to a CAM in such a manner that a search rate has a predetermined value or more, thereby generating a power control search enable signal PC_SE for reducing a fluctuation in a source current in the LSI. The command search enable signal CD_SE and the power control search enable signal PC_SE are transmitted as a search enable signal SE through the OR gate 11 to the CAM macro cell array 4.

Figure 4:
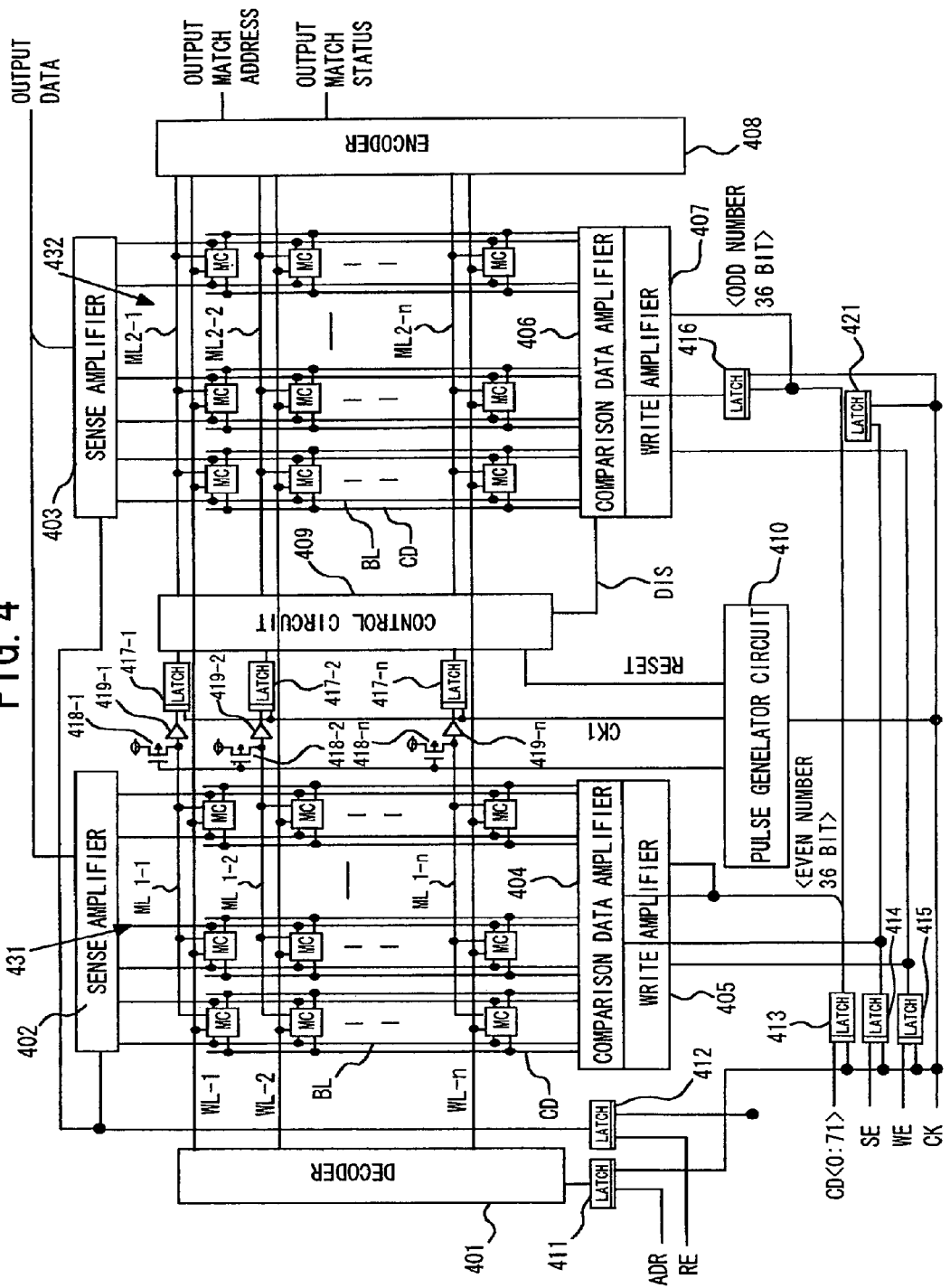
FIG. 4 is a circuit diagram showing an example of the structure of the CAM macro cell.

FIG. 4 typically shows one of the structures of the CAM macro cells.

The CAM macro cell 40 shown in FIG. 4 is not particularly restricted but has a 64-entry by 72-bit structure. The comparison of the bit of a former stage portion in the entry data with the corresponding bit of the comparison data and the comparison of the bit of a latter stage portion in the entry data with the corresponding bit of the comparison data are carried out by a pipeline processing. For this reason, a division into a first memory cell group 431 and a second memory cell group 432 is carried out. Both the first memory cell group 431 and the second memory cell group 432 have a 64-entry by 36-bit structure, which is not particularly restricted.

The first memory cell group 431 includes a plurality of memory cells MC provided in the cross portions of a plurality of word lines WL-1, WL-2, . . . , WL-n and a plurality of bit lines BL and a plurality of comparison data lines CD which are provided to cross. The word lines WL-1, WL-2, . . . , WL-n are selectively driven to a predetermined level in response to a signal output from a decoder 401 for decoding an input address signal. The bit lines BL are coupled to a sense amplifier 402 and data read from the first memory cell group 431 are amplified by the sense amplifier 402 and are then output. The comparison data lines CD are coupled to a comparison data amplifier 404 and comparison data amplified by the comparison data amplifier 404 are supplied to the comparison data lines CD. In the first memory cell group 431, a plurality of match signal lines ML1-1, ML1-2, . . . , ML1-n are provided in parallel with the word lines WL-1, WL-2, WL-n and a match signal to be the result of the comparison of the bit of the former stage portion in the entry data with the corresponding bit of the comparison data is obtained by the match signal lines ML1-1, ML1-2, . . . , ML1-n. The match signals obtained by the match signal lines ML1-1, ML1-2, . . . , ML1-n are transmitted to latch circuits 417-1, 417-2, . . . , 417-n in a latter stage through buffers 419-1, 419-2, . . . , 419-n respectively and are then latched therein. The signals (match signals) output from the latch circuits 417-1, 417-2, . . . , 417-n are input to a control circuit 409 in the latter stage. The control circuit 409 has a function of asserting a mismatch signal DIS to have a low level when all of the match signals output from the latch circuits 417-1, 417-2, . . . , 417-n are set to have the low level. The bit lines BL are coupled to a write amplifier 405 and write data amplified by the write amplifier 405 are transmitted to the bit lines BL so that data can be written to each of the memory cells MC in the first memory cell group 431.

A pulse generator circuit 410 is provided. In the pulse generator circuit 410, a precharge signal PCG, a clock signal CK1 and a reset signal RESET are generated. The operation of a p-channel type MOS transistor for precharging is controlled in response to the precharge signal PCG, the operations of the latch circuits 417-1, 417-2, . . . , 417-n are controlled in response to the clock signal CK1, and the control circuit 409 is reset in response to the reset signal RESET.

The second memory cell group 432 includes a plurality of memory cells MC provided in the cross portions of a plurality of word lines WL-1, WL-2, . . . , WL-n and a plurality of bit lines BL and a plurality of comparison data lines CD which are provided to cross. The bit lines BL are coupled to a sense amplifier 403 and data read from the second memory cell group 432 are amplified by the sense amplifier 403 and are then output. The comparison data lines CD are coupled to a comparison data amplifier 406 and comparison data amplified by the comparison data amplifier 406 are supplied to the comparison data lines CD. The comparison data amplifier 406 is activated to supply comparison data to the comparison data line CD when the mismatch signal DIS sent from the control circuit 409 has a high level. When the mismatch signal DIS sent from the control circuit 409 has a low level, however, the comparison data amplifier 406 is brought into an inactive state and the comparison data are not supplied to the comparison data line CD. In other words, when the mismatch signal DIS sent from the control circuit 409 has a high level, a comparison with data stored in the second memory cell group 432 is not carried out. The comparison data amplifier 406 is formed by a plurality of AND gates 624 provided corresponding to the comparison data lines.

In the second memory cell group 432, a plurality of match signal lines ML2-1, ML2-2, . . . , ML2-n is provided in parallel with the word lines WL-1, WL-2, . . . , WL-n, and match signals to be the result of the comparison of the bit of a former stage portion in the entry data with the corresponding bit of the comparison data are obtained by the match signal lines ML2-1, ML2-2, . . . , ML2-n. The match signal lines ML-1, ML-2, . . . , ML-n are transmitted to an encoder 408 and are encoded therein so that match address outputs and match status outputs are obtained. The bit lines BL are coupled to a write amplifier 407 and write data amplified by the write amplifier 407 are transmitted to the bit lines BL so that data can be written to each of memory cells MC in the second memory cell group 432.

A latch circuit 411 is provided and an address signal ADR is fetched through the latch circuit 411. The address signal ADR thus fetched is transmitted to the decoder 401. A latch circuit 412 is provided and a read enable signal RE indicative of the validity of a read operation is fetched through the latch circuit 412. The read enable signal RE thus fetched is transmitted to the sense amplifiers 402 and 403. A latch circuit 413 is provided. The latch circuit 413 fetches comparison data CD<0:71> having a 72-bit structure, for example. Comparison data corresponding to even number 36 bits in the comparison data CD<0:71> having the 72-bit structure are transmitted to the write amplifier 405 for a write to the first memory cell group 431, and furthermore, are transmitted to the comparison data amplifier 404 for a comparison with data stored in the first memory cell group 431, which is not particularly restricted. Moreover, comparison data corresponding to odd number 36 bits in the comparison data CD<0:71> having the 72-bit structure are transmitted to the write amplifier 407 for a write to the second memory cell group 432, and furthermore, are transmitted to the comparison data amplifier 406 through a latch circuit 416 for a comparison with the data stored in the first memory cell group 431. Latch circuits 414 and 421 are provided. The latch circuits 414 and 421 fetch a search enable signal SE indicative of the validity of a comparing operation. The search enable signal SE thus fetched is utilized for activating the comparison data amplifiers 404 and 406. A latch circuit 415 is provided. The latch circuit 415 fetches a write enable signal WE indicative of the validity of a write operation. The write enable signal WE thus fetched is used for activating the write amplifiers 405 and 406. Each of the latch circuits 411, 412, 413, 414, 415, 416 and 421 is operated synchronously with a clock signal CK.

Figure 5:
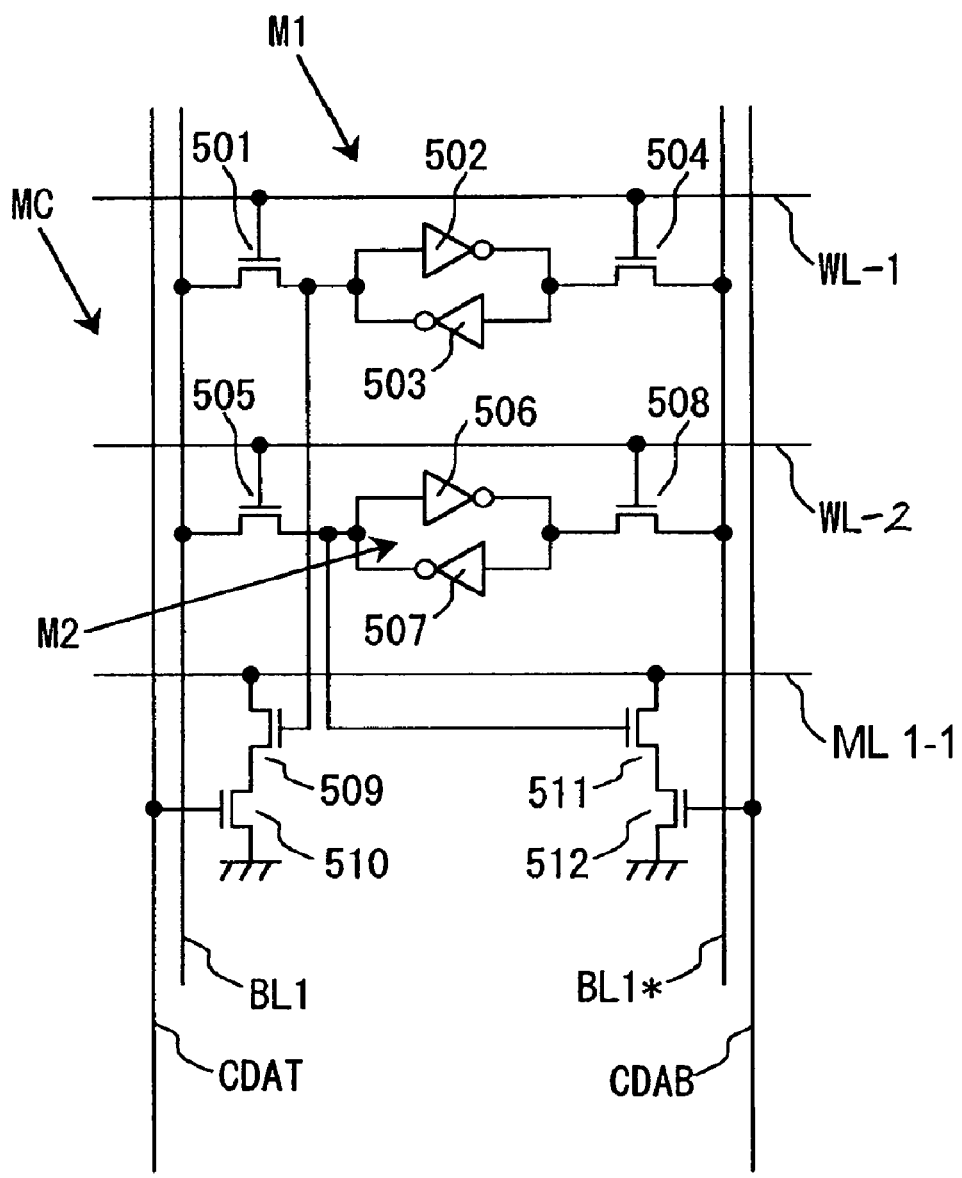
FIG. 5 is a circuit diagram showing an example of the structure of a main part in FIG. 4.

FIG. 5 typically shows an example of the structure of one of the memory cells MC.

The structure shown in FIG. 5 is of a ternary type. A pair of bit lines BL include bit lines BL1 and BL1*. In storage portions M1 and M2, a pair of bit lines BL1 and BL1* are shared. Therefore, a word line WL is provided with a word line WL-1-1 for normal data and a word line WL-1-2 for mask data, and a word line driving cycle is shifted so that different data from each other can be written to the storage portions M1 and M2. Inverters 502 and 503 are coupled like a loop so that the storage portion M1 is formed. One of the storage nodes of the storage portion M1 is coupled to the bit line BL1 through an n-channel type MOS transistor 501 to be a transfer unit. The other storage node of the storage portion M1 is coupled to the bit line BL1* through an n-channel type MOS transistor 504 to be the transfer unit. Moreover, inverters 506 and 507 are coupled like a loop so that the storage portion M2 is formed. One of the storage nodes of the storage portion M2 is coupled to the bit line BL1 through an n-channel type MOS transistor 505 to be the transfer unit. The other storage node of the storage portion M2 is coupled to the bit line BL1* through an n-channel type MOS transistor 508 to be the transfer unit. The inverters 502, 503, 506 and 507 are constituted by connecting the p-channel type MOS transistor and the n-channel type MOS transistor in series, respectively. Moreover, n-channel type MOS transistors 509 and 510 are connected in series so that a first comparing circuit is formed, and n-channel type MOS transistors 511 and 512 are connected in series so that a second comparing circuit is formed. The gate electrode of the n-channel type MOS transistor 509 is coupled to one of the storage nodes of the storage portion M1, and the gate electrode of the n-channel type MOS transistor 510 is coupled to a comparison data line CDAT. The gate electrode of the n-channel type MOS transistor 511 is coupled to one of the storage nodes of the storage portion M2, and the gate electrode of the n-channel type MOS transistor 512 is coupled to a comparison data line CDAB. The comparison of comparison data fetched through the comparison data lines CDAT and CDAB with the data stored in the storage portions M1 and M2 is carried out by the first comparing circuit (509, 510) and the second comparing circuit (511, 512). The result of the comparison is fetched through the match signal line ML1-1.

Figure 6:
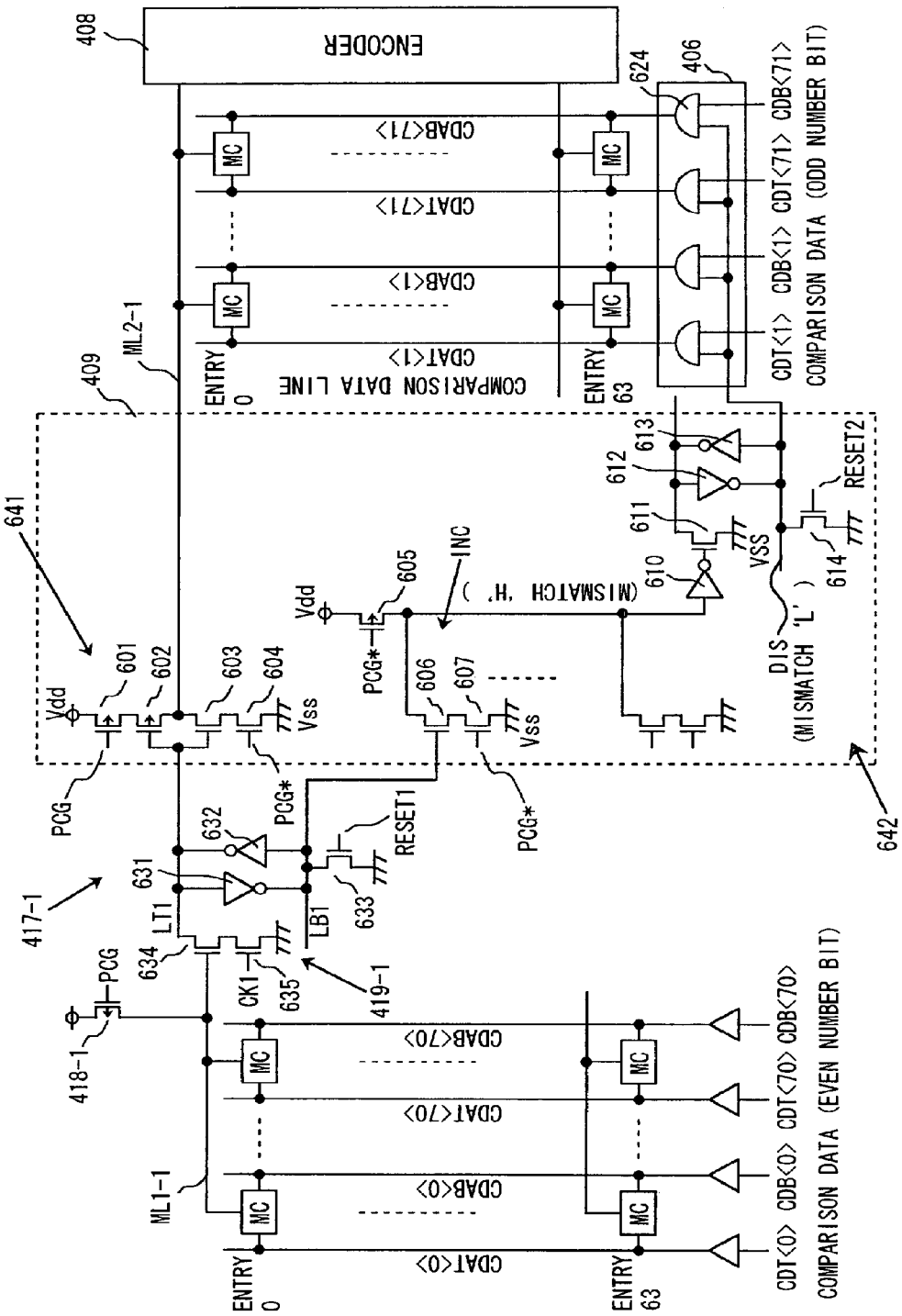
FIG. 6 is a circuit diagram showing an example of the structure of the main part in FIG. 4.

FIG. 6 shows an example of the detailed structure of the main part in FIG. 4.

The buffer 419-1 is constituted by connecting two n-channel type MOS transistors 634 and 635 in series. The signal of the match signal line ML1-1 is transmitted to the gate electrode of the n-channel type MOS transistor 634. A clock signal CK1 is supplied to the gate electrode of the n-channel type MOS transistor 635. When the clock signal CK1 has a high level, the n-channel type MOS transistor 635 is conducted and the n-channel type MOS transistor 634 is driven corresponding to the signal level of the match signal line ML1-1 so that a signal can be transmitted to the latch circuit 417-1. Other buffer circuits 418-2 to 418-n are also constituted in the same manner as a buffer circuit 418-1. The latch circuit 417-1 is formed by coupling two inverters 631 and 632 like a loop. The other latch circuits 417-2 to 417-n are also constituted in the same manner as the latch circuit 417-1.

The control circuit 409 is provided corresponding to the latch circuits 417-1 to 417-n, and includes a plurality of precharge circuits 641 for controlling the precharge of the match signal lines ML2-1 to ML2-n based on the output signals of the corresponding latch circuits and a mismatch signal forming circuit 642 for forming a mismatch signal DIS based on the output signals of the latch circuits 417-1 to 417-n. The precharge circuits 641 have identical structures to each other. As typically shown in an example of the structure of one of the precharge circuits 641, p-channel type MOS transistors 601 and 602 and n-channel type MOS transistors 603 and 604 are connected in series. The gate electrodes of the p-channel type MOS transistor 602 and the n-channel type MOS transistor 603 are connected to a storage node LT1 of the latch circuit 417-1 in common so that they function as inverters for logically inverting and outputting the output signal of the storage node LT1. A precharge signal PCG is transmitted to the gate electrode of the p-channel type MOS transistor 601. A signal PCG* obtained by logically inverting the precharge signal PCG is transmitted to the gate electrode of the n-channel type MOS transistor 604.

The mismatch signal forming circuit 642 is provided corresponding to the latch circuits 417-1 to 417-n, and includes a plurality of input circuits INC for fetching the output signal of the corresponding latch circuit, an inverter 610 for fetching the output signals of the input circuits INC, an n-channel type MOS transistor 611 to be driven by the inverter 610, a latch circuit 651 to be driven by the n-channel type MOS transistor 611, and an n-channel type MOS transistor 614 for resetting the latch circuit 651 based on a reset signal RESET2. As typically shown in an example of the structure of one of the input circuits INC, they are formed by connecting two n-channel type MOS transistors 606 and 607 in series. The output signal of a storage node LB1 in the latch circuit 417-1 is transmitted to the gate electrode of the n-channel type MOS transistor 606. The logical inverted signal PCG* of the precharge signal PCG is transmitted to the gate electrode of the n-channel type MOS transistor 607.

Figure 3:
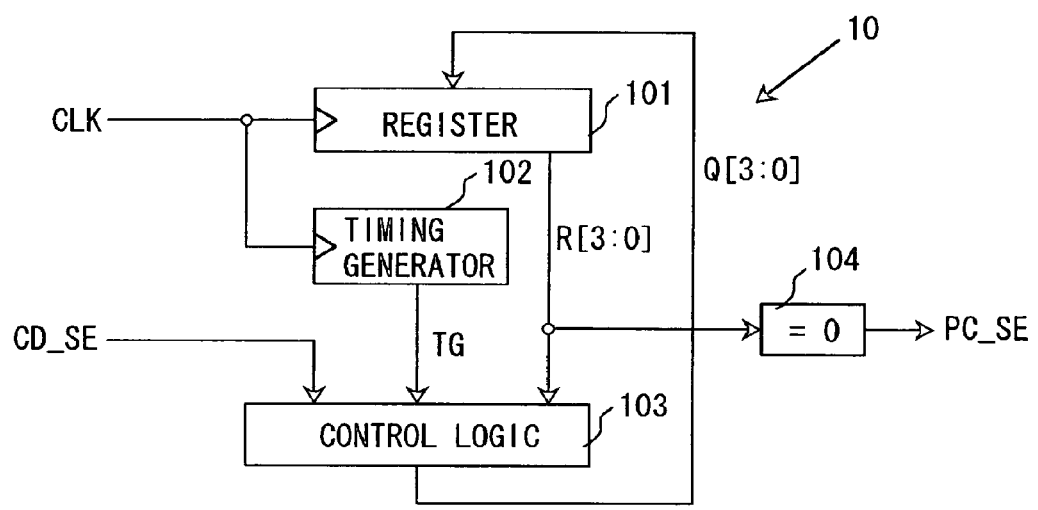
FIG. 3 is a block diagram showing an example of the structure of a power controller included in the LSI for a CAM.

FIG. 3 shows an example of the structure of the power controller 10.

As shown in FIG. 3, the power controller 10 includes a register 101, a timing generator 102, a control logic 103 and a comparing circuit 104. The register 101 is not particularly restricted but has a 4-bit structure. In the register 101 having the 4-bit structure, a hold value is updated synchronously with a clock signal CLK. An output value R[3:0] of the register 101 is transmitted to the control logic 103 and the comparing circuit 104. The timing generator 102 sets a search request signal TG to have a high level at a constant ratio synchronously with the clock signal CLK. The control logic 103 generates an update value Q[3:0] of the register 101 in accordance with a truth table shown in FIG. 13. The comparing circuit 104 sets a search request signal PC_SE to have a logical value of '1' when the output value of the register 101 is a logical value of '0'.

Figure 12:
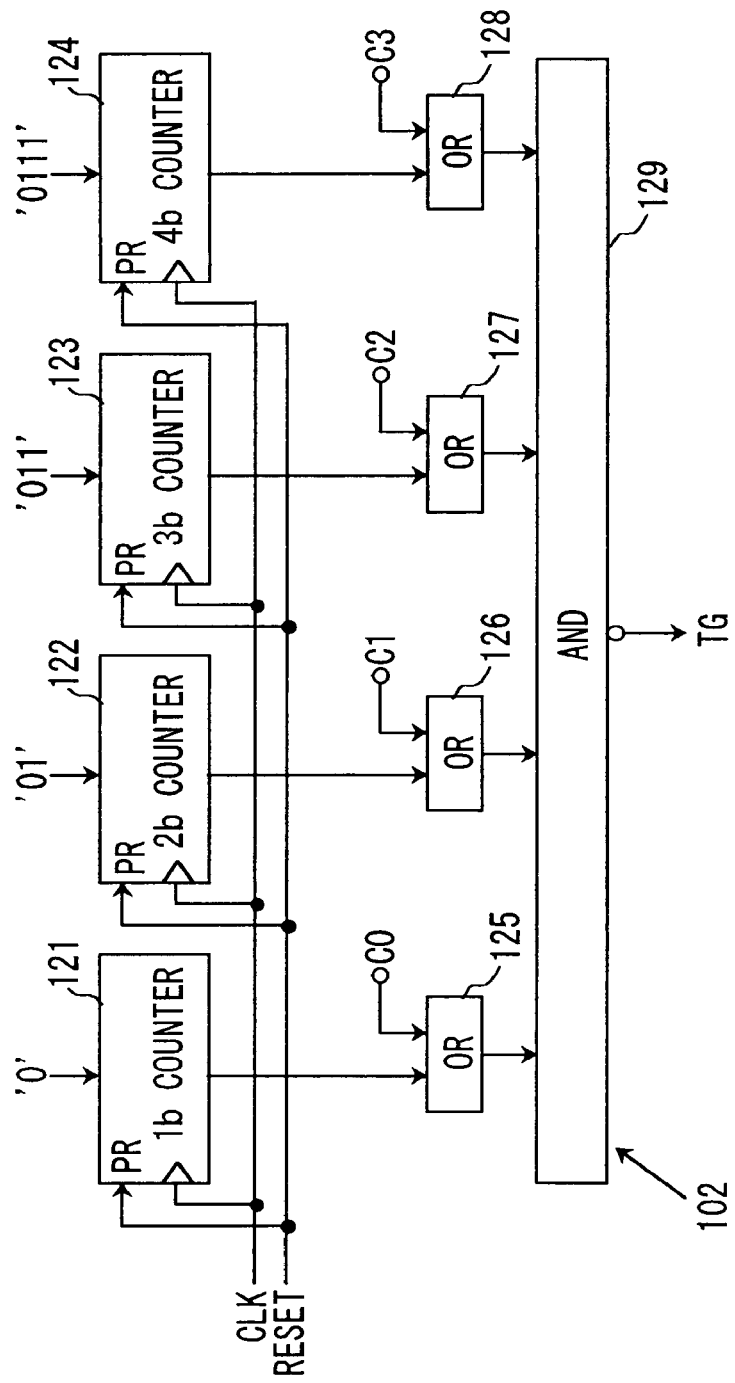
FIG. 12 is a block diagram showing an example of the structure of a main part in FIG. 3.

FIG. 12 shows an example of the structure of the timing generator 102.

As shown in FIG. 12, the timing generator 102 includes a subtrahend counter 121 having a 1-bit structure, a subtrahend counter 122 having a 2-bit structure, a subtrahend counter 123 having a 3-bit structure, a subtrahend counter 124 having a 4-bit structure, OR gates 125 to 128, and an AND gate 129. Control signals C0 to C4 serve to carry out a search rate control. The control signals C0 to C4 are supplied through a register provided in a semiconductor chip or an external terminal. In the OR gates 125 to 128, the OR logic of the output signals of the corresponding counters 121 to 124 and the control signals C0 to C4 is obtained. The AND gate 129 is obtained by the AND logic of the output signals of the OR gates 125 to 128.

Next, the operation of the structure will be described.

Figure 7:
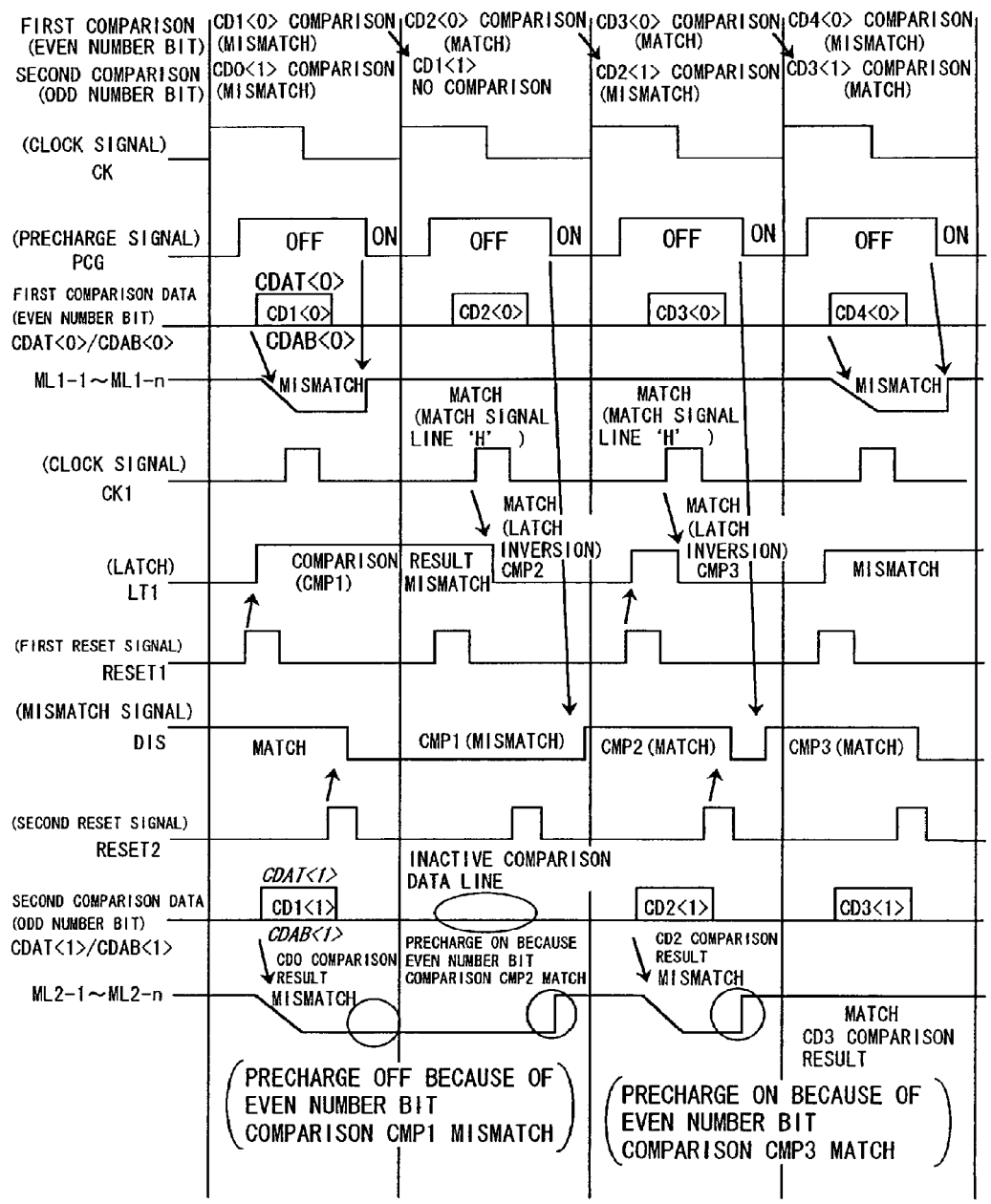
FIG. 7 is an operation timing chart showing the structure illustrated in FIG. 6.

When a write enable signal WE is asserted to have a high level, the write amplifiers 405 and 407 are activated so that entry data having a 72-bit structure can be written through the latch circuit 413. In this case, entry data corresponding to even number 36 bits are written to the first memory cell group 431 through the write amplifier 405 and entry data corresponding to odd number 36 bits are written to the second memory cell group 432 through the write amplifier 407. In a state in which a search enable signal SE is asserted to have the high level, then, input comparison data and the entry data are compared with each other. In the comparison, a data comparing operation corresponding to the even number 36 bits and a data comparing operation corresponding to the odd number 36 bits are carried out with age so that the pipeline processing of the comparing operation can be carried out as shown in FIG. 7. In FIG. 7, it is assumed that the comparison data are input in order of CD0, CD1, CD2 and CD3. A comparing operation for an even number bit CD1<0> of the comparison data and a comparing operation for comparison data CD0<1> are carried out at the same time, a comparing operation for an even number bit CD2<0> of the comparison data and a comparing operation of comparison data CD1<1> are carried out at the same time, a comparing operation for an even number bit CD3<0> of the comparison data and a comparing operation of comparison data CD2<1> are carried out at the same time, and a comparing operation for an even number bit CD4<0> of the comparison data and a comparing operation of comparison data CD3<1> are carried out at the same time.

In the comparison, a precharge signal PCG is negated to have the high level. Consequently, the match signal lines ML1-1 to ML1-n are not precharged. When comparison data corresponding to even number 36 bits in the comparison data having the 72-bit structure are input to the comparison data amplifier 404, the comparison data line CD is driven by the comparison data amplifier 404 depending on the comparison data corresponding to the even number 36 bits. One of the comparison data lines in the comparison data line CD having a complementary level is set to have the high level so that a comparison with data stored in each memory cell MC is carried out. In case of the memory cell of a ternary type shown in FIG. 5, electric charges stored in the match signal line ML1-1 are discharged when data are mismatched. The state of the match signal line ML-1 is fetched into the latch circuit 417-1 synchronously with the clock signal CK1. The latch circuit 417-1 is previously reset in response to a reset signal RESET1 and the storage node LT1 has the high level. The storage node LT1 is changed to have a low level when the data are matched with each other in the data comparison, and the storage node LT1 is maintained to have the high level when the data are mismatched. The results of the comparison of entries 0 to 63 are held in the corresponding latch circuits 417-1 to 417-n. In the control circuit 409, the information collection of the latch circuits 417-1 to 417-n is carried out through the input circuit INC. In the case in which at least one matched entry is present, the match signal lines ML2-1 to ML2-n corresponding thereto are precharged through the p-channel type MOS transistors 601 to 602 and a data comparison corresponding to the odd number 36 bits is then carried out. In other words, in the case in which at least one matched entry is present, the input terminal of the inverter 610 has a high (H) level and the mismatch signal DIS has the high (H) level. In the comparison data amplifier 406, consequently, comparison data corresponding to odd number bits are supplied to the corresponding comparison data lines through the AND gates 624 so that the entry data corresponding to the odd number 36 bits and the comparison data corresponding to the odd number 36 bits are compared with each other.

In the comparison of the entry data corresponding to the even number 36 bits with the comparison data corresponding to the even number 36 bits, however, it is implied that matched data with the input comparison data are not present in the entry data of the CAM macro cell 40 when all of the entries 0 to 63 are mismatched, and the data comparison corresponding to the odd 36 bits is useless. For this reason, such a comparison is not carried out. More specifically, in the comparison of the entry data corresponding to the even number 36 bits with the comparison data corresponding to the even number 36 bits, the mismatch signal DIS is set to have a low (L) level and the AND gates 624 in the comparison data amplifier 406 are brought into an inactive state when all of the entries 0 to 63 are mismatched. Therefore, the comparison data corresponding to the odd number bits are not transmitted to the comparison data line.

Figure 10:
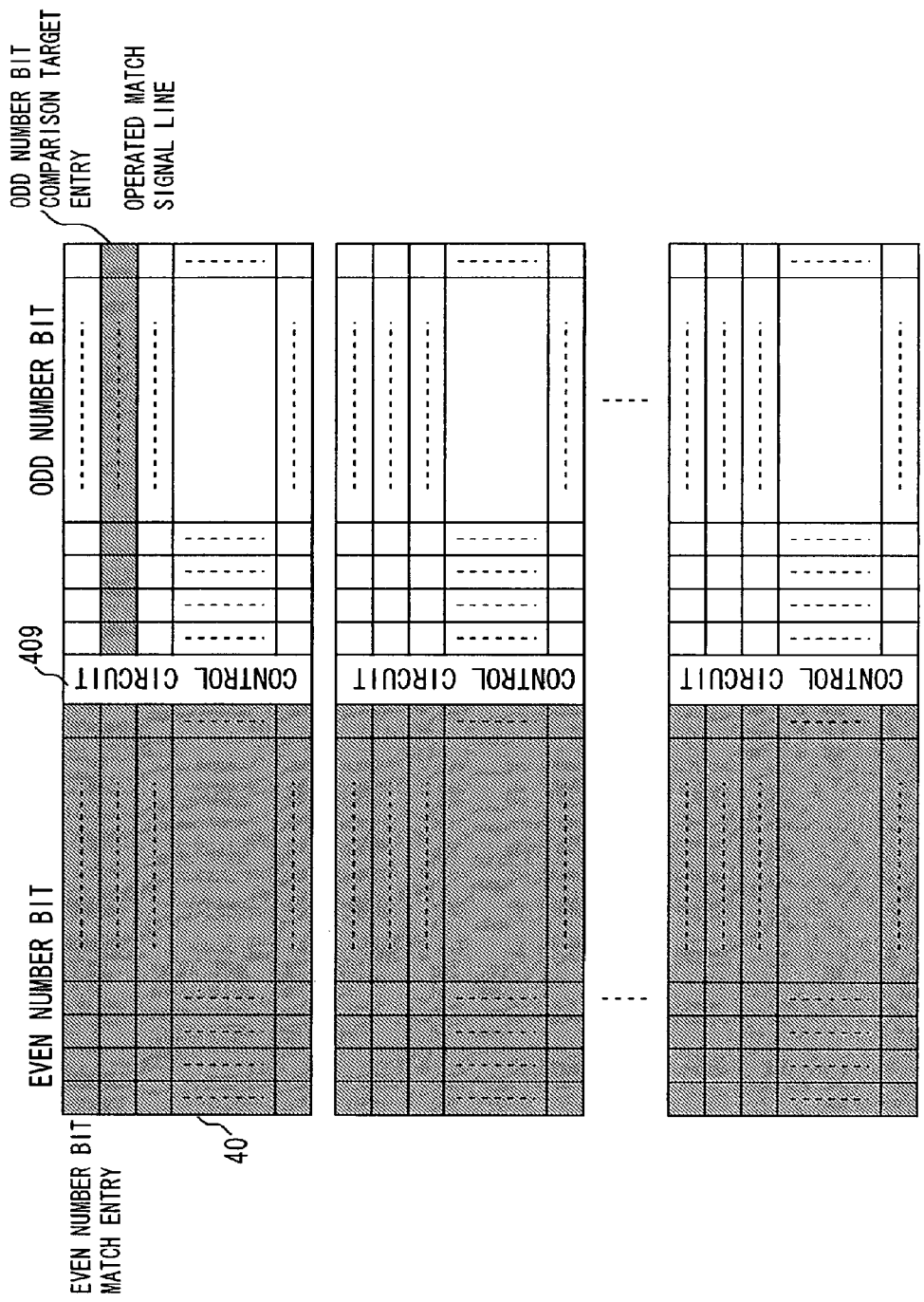
FIG. 10 is an explanatory diagram showing the activating area of a comparing circuit illustrated in FIG. 6.

In the structure shown in FIG. 6, the precharge is carried out through the p-channel type MOS transistor 602 in the control circuit 409. In the mismatch entry, therefore, the match signal lines ML2-1 to ML2-n corresponding thereto are not precharged. Accordingly, a region in which the comparison corresponding to the even number 36 bits including the match entry is carried out and an odd number bit comparison target entry are activated by the comparing operation as shown in FIG. 10. The mismatch entry is not activated. Therefore, the number of the signal lines to be activated in one cycle is decreased. Consequently, a consumed power can be reduced.

In the timing generator 102 shown in FIG. 12, moreover, when the reset signal RESET is input, the counters 121 to 124 are set to be '0', '01', '011' and '0111' respectively. Every time the clock signal CLK is input, the counters 121 to 124 are subtracted by one. The counters 121 to 124 are set to be circulating counters and are subtracted from 0, respectively. All of the bits have a logical value of '1'. The AND logic of the outputs of the OR gates 125 to 128 is taken and a logical output thereof is obtained as TG. In the example, when at least one of the four counters 121 to 124 has a logical value of '0', a search request is set to be the logical value of '1'. It is possible to set a search rate into 16 stages in response to the control signals C0 to C3.

Figure 14:
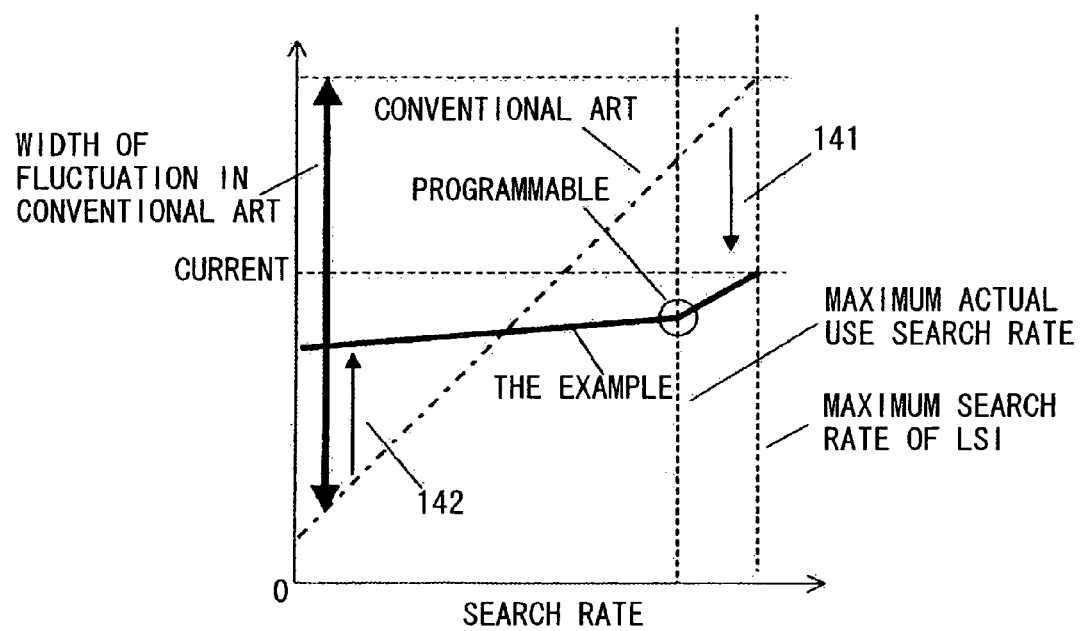
FIG. 14 is an explanatory chart showing a relationship between a search rate and a source current in the LSI for a CAM.

FIG. 14 shows a search rate and a source current in an LSI for a CAM.

While the source current is greatly changed for the search rate in the conventional art, the control signals C0 to C3 are set (programmed) corresponding to the maximum actual use search rate of a device using the LSI for a CAM and a dummy search is carried out so that the maximum current of the LSI can be reduced, and furthermore, a fluctuation in the source current can be reduced considerably in the example. More specifically, it is possible to reduce the source current as shown in an arrow 141 by making a division into a data comparison corresponding to even number 36 bits and a data comparison corresponding to even number 36 bits, and furthermore, it is possible to always consume a current by such a dummy search as to set the search rate to have a predetermined value or more, thereby reducing the width of a fluctuation in the source current as shown in an arrow 142.

Figure 15:
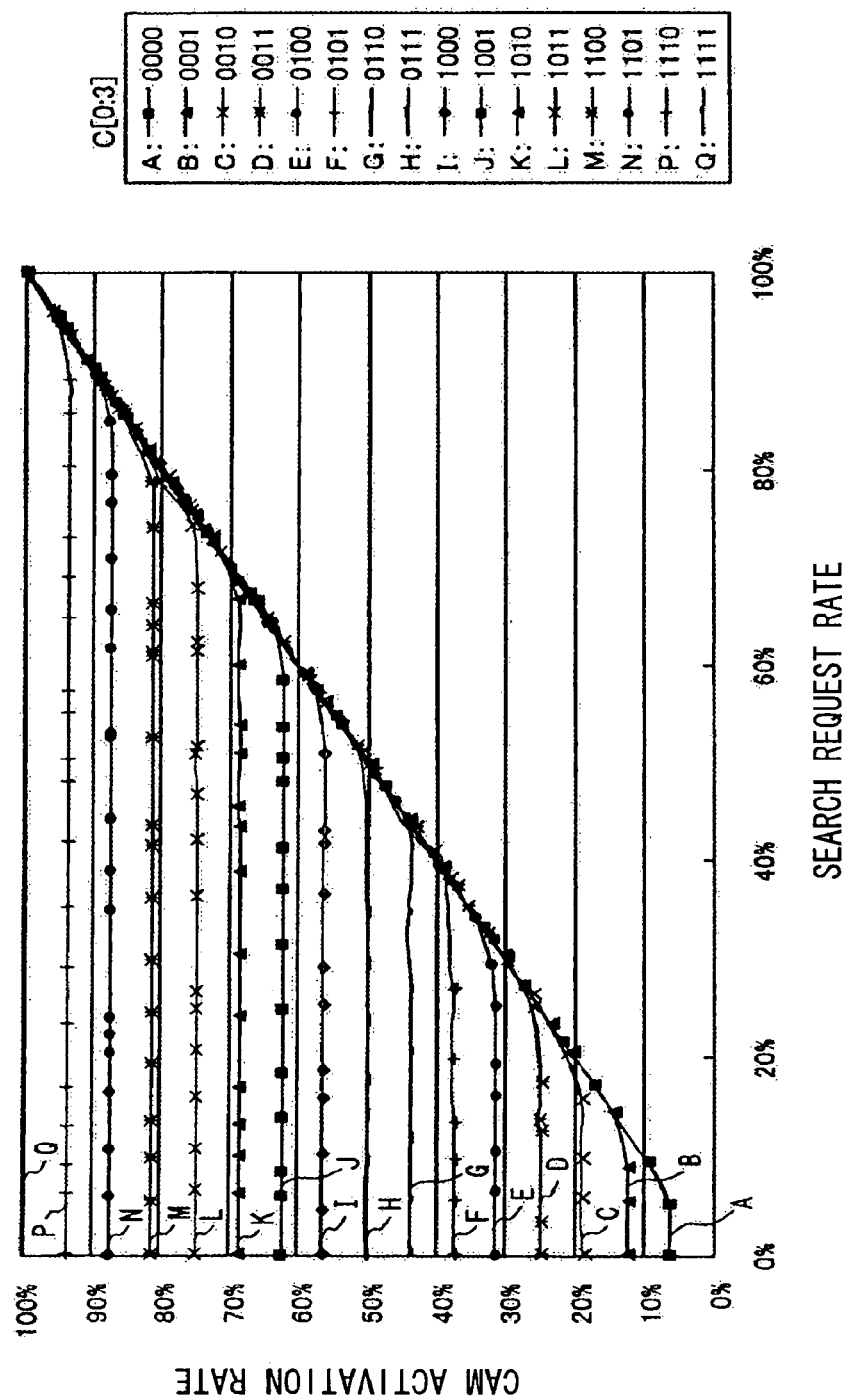
FIG. 15 is an explanatory chart showing a relationship between a search request rate to the LSI for a CAM and a CAM activation rate.

FIG. 15 shows a relationship between a search request rate to the LSI for a CAM and a CAM activation rate. The control signals C0 to C3 are set to be parameters. If nothing is done, the CAM activation rate is also decreased in proportion to a reduction in the search request rate. On the other hand, the control signals C0 to C3 are properly set to carry out the dummy search so that the CAM activation rate for the search request can be set to be constant. As shown in characteristic curves A to Q in FIG. 15, when the values of the control signals C0 to C3 are increased, the CAM activation rate is stabilized within a wide range.

According to the example, the following functions and advantages can be obtained.

(1) In the control circuit 409, the precharge is carried out through the p-channel type MOS transistor 602. In the mismatch entry, therefore, the match signal lines ML2-1 to ML2-n corresponding thereto are not precharged. Accordingly, the region in which the comparison corresponding to the even number 36 bits including the match entry is carried out and the odd number bit comparison target entry are activated by the comparing operation as shown in FIG. 10. The mismatch entry is not activated. Therefore, the number of the signal lines to be activated in one cycle can be decreased. Consequently, a consumed power can be reduced.

(2) In the timing generator 102, when the reset-signal RESET is input, the counters 121 to 124 are set to be '0', '01', '011'and '0111' respectively. Every time the clock signal CLK is input, the counters 121 to 124 are subtracted by one. The counters 121 to 124 are set to be the circulating counters and are subtracted by 0, respectively. All of the bits have the logical value of '1'. The AND logic of the outputs of the OR gates 125 to 128 is taken and the logical output thereof is obtained as TG. In the example, in the case in which at least one of the four counters 121 to 124 has the logical value of '0', the search request is set to have the logical value of '1'. It is possible to set the search rate into 16 stages in response to the control signals C0 to C3. By properly setting the control signals C0 to C3, it is possible to carry out the dummy search for reducing a fluctuation in a consumed current.

(3) The entry data corresponding to the even number 36 bits are written to the first memory cell group 431 through the write amplifier 405 and the entry data corresponding to the odd number 36 bits are written to the second memory cell group 432 through the write amplifier 407. In the state in which the search enable signal is asserted to have the high level, then, the input comparison data and the entry data are compared with each other. In the comparison, the data comparing operation corresponding to the even number 36 bits and the data comparing operation corresponding to the odd number 36 bits are carried out with age. Consequently, the pipeline processing of the comparing operation can be carried out as shown in FIG. 7. Thus, it is possible to efficiently perform the search.

(4) In the CAM macro cell 40, the bit line BL is used for writing data to the memory cell MC and reading the data from the memory cell MC, and the comparison data line CD for a data comparison is provided separately therefrom. Therefore, it is possible to fetch the comparison data by using the comparison data line CD, thereby carrying out the data search simultaneously with the write of the data to the memory cell MC and the read of the data from the memory cell MC. In other words, it is possible to carry out the dummy search for reducing a fluctuation in a consumed current by properly setting the control signals C0 to C3 in the operation for reading the data or the operation for writing the data. Therefore, it is possible to stabilize the consumed current of the LSI for a CAM.

While the invention made by the inventor has specifically been described above, the invention is not restricted thereto but it is apparent that various changes can be made without departing from a scope thereof.

Figure 8:
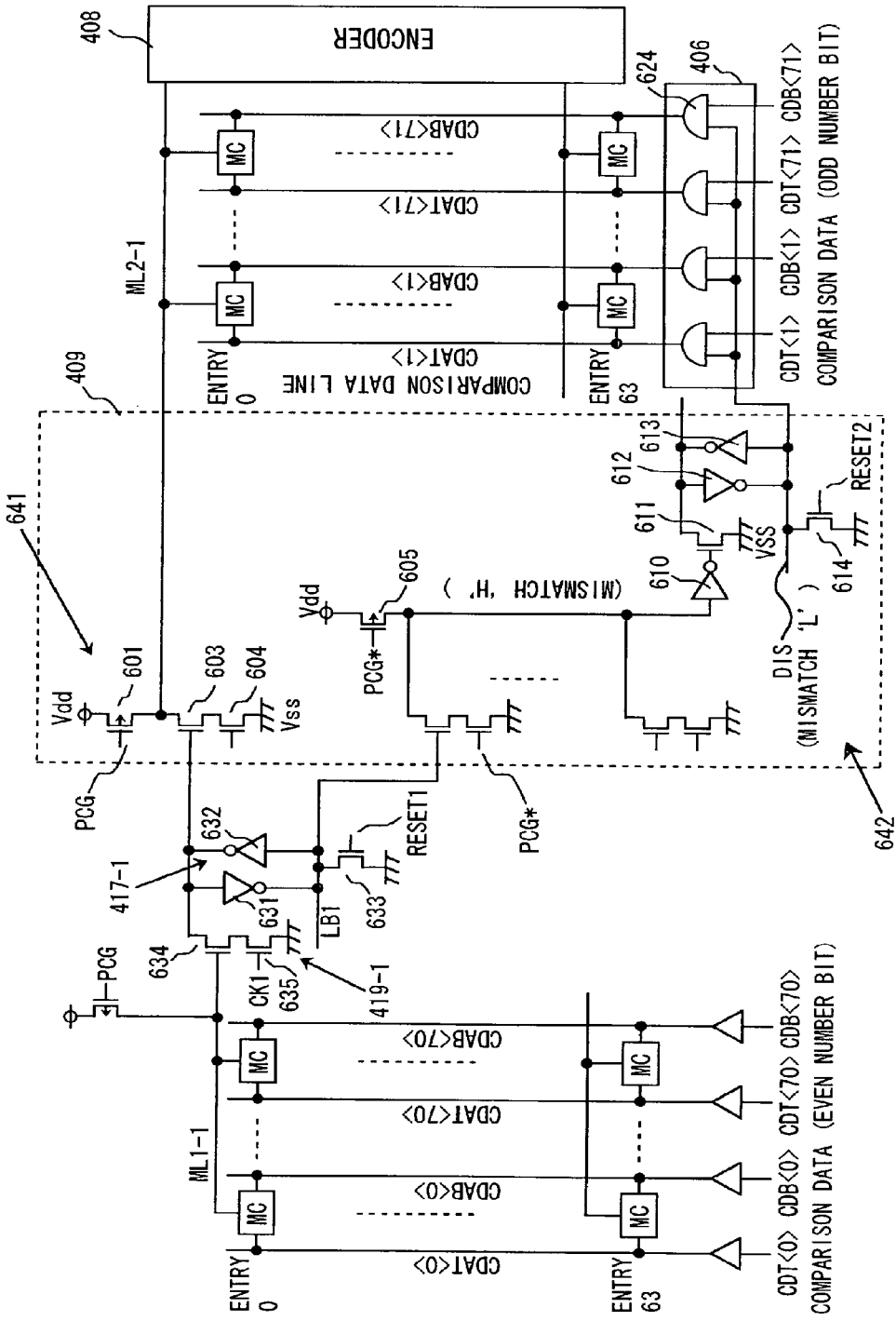
FIG. 8 is a circuit diagram showing another example of the structure of the main part in FIG. 4.
Figure 9:
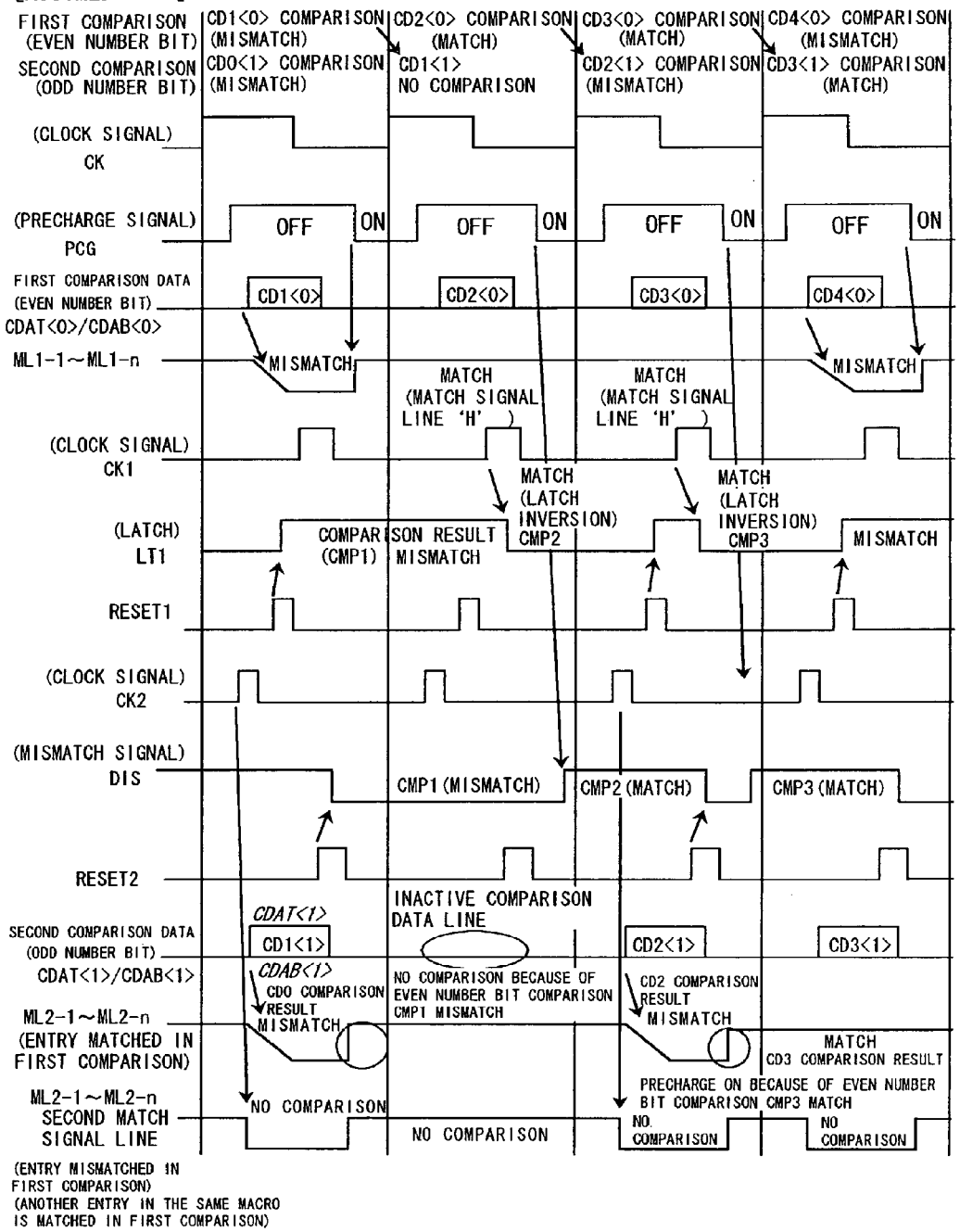
FIG. 9 is an operation timing chart showing the structure illustrated in FIG. 8.
Figure 11:
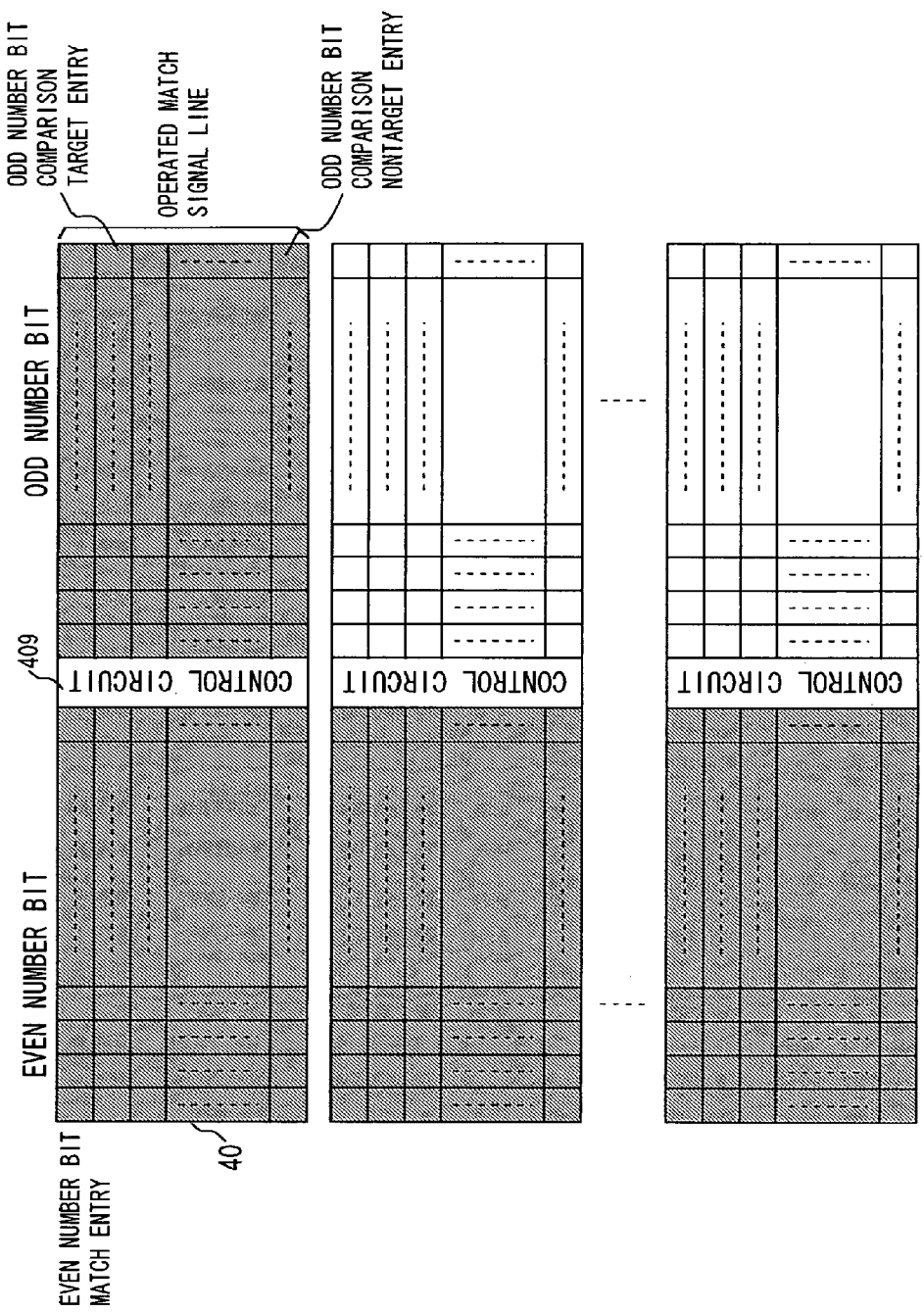
FIG. 11 is an explanatory diagram showing the activating area of a comparing circuit illustrated in FIG. 8.

For example, it is possible to employ the structure shown in FIG. 8 in place of the structure shown in FIG. 6. FIG. 9 shows an operation timing in that case. The structure shown in FIG. 8 is greatly different from the structure shown in FIG. 6 in respect of the structures of the precharge circuits 641 and the control of the operation of the encoder 408 in response to the output signal of the mismatch signal forming circuit 642. More specifically, a component corresponding to the p-channel type MOS transistor 602 in the circuit shown in FIG. 6 is not present in FIG. 8. In the structure shown in FIG. 8, accordingly, the match signal lines ML2-1 to ML2-n are precharged irrespective of the result of the data comparison corresponding to the even number 36 bits. As shown in FIG. 11, therefore, an odd number bit comparison nontarget entry is also activated in addition to the odd number bit comparison target entry.

In the case in which the results of the data comparison corresponding to the even number 36 bits are mismatched in all of the entries in the macro cell, the comparison data for the data comparison corresponding to the odd number 36 bits are not activated. For this reason, the match signal lines ML2-1 to ML2-n are maintained to have the high level and the operating current does not flow. There is a possibility that the high level of the match signal lines ML2-1 to ML2-n might be mistaken for "a data match". Therefore, the encoder 408 is controlled by the mismatch signal line DIS. In the case in which there is a matched entry in the data comparison corresponding to the even number 36 bits, the match signal lines ML2-1 to ML2-n in the mismatch entry are set to have the low level by a discharge synchronously with a timing pulse clock signal CK2 after the match signal lines ML2-1 to ML2-n are precharged. Such a discharge is carried out in the encoder 408 based on the mismatch signal DIS. Consequently, only the entry matched in the data comparison corresponding to the even number 36 bits becomes a data comparison target corresponding to the odd number 36 bits.

While the entry is divided into the even number bit and the odd number bit in the example, moreover, it may be divided into an upper side bit and a lower side bit in the data and the division of the entry is not restricted to two parts but the entry can be divided into a plurality of bit portions.

In the case in which the CAM macro cells 40 are arranged in an array as shown in FIG. 2, furthermore, they can be operated synchronously with a common clock signal. Such an embodiment will be described with reference to FIGS. 16 to 29.

Figure 16:
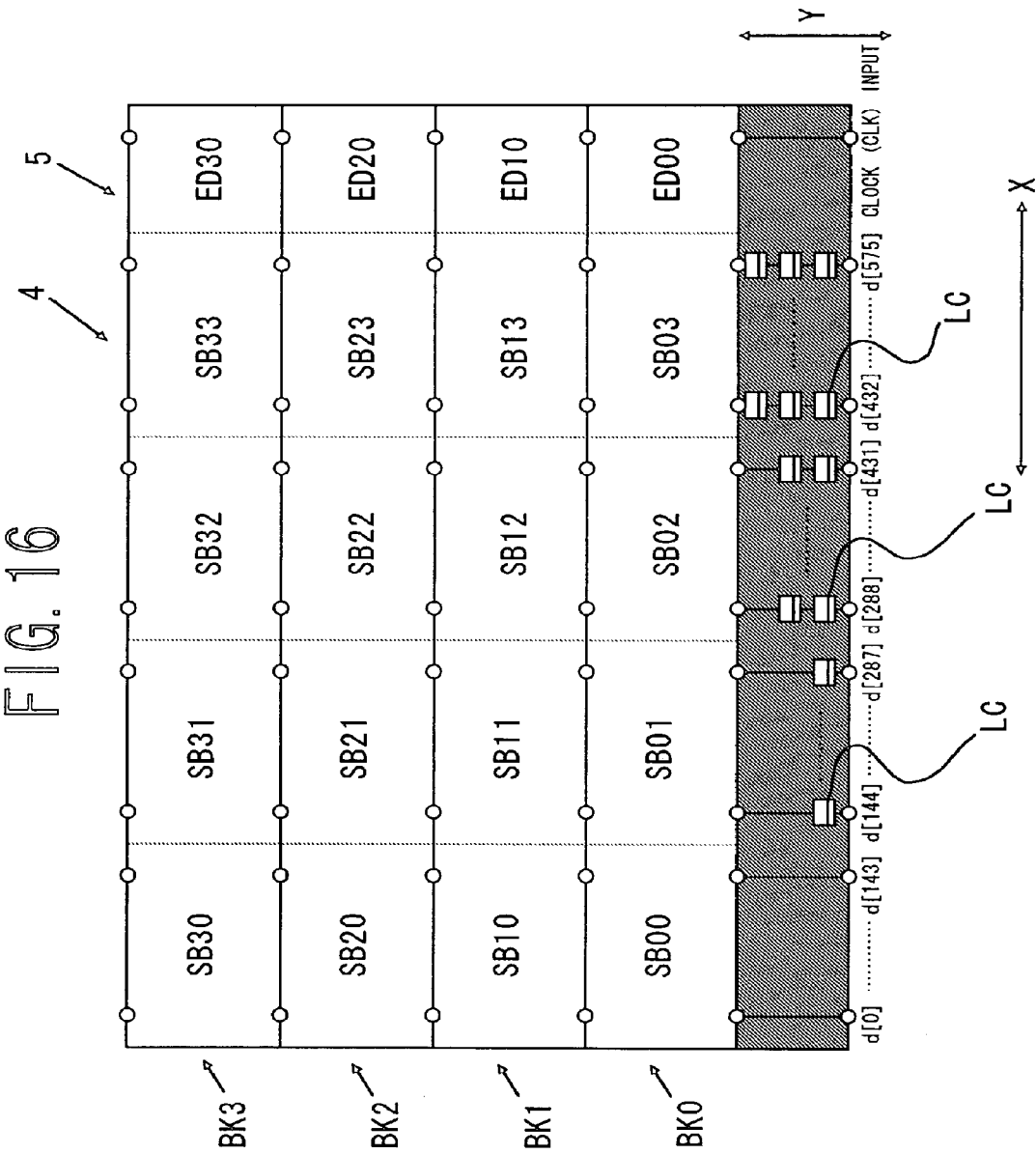
FIG. 16 is an explanatory diagram showing another example of the structure of the CAM macro cell array.

FIG. 16 shows another example of the structure of the CAM macro cell array 4. In FIG. 16, a division into four blocks BK0, BK1, BK2 and BK3 having a 128-entry by 576-bit structure is carried out and four encoder portions ED00, ED10, ED20 and ED30 are provided corresponding to the four blocks BK0, BK1, BK2 and BK3, which is not particularly restricted. The four encoder portions ED00, ED10, ED20 and ED30 are equivalent to the priority encoder 5 in FIG. 1. Each of the four blocks BK0, BK1, BK2 and BK3 is divided into four subblocks. More specifically, the block BK0 is divided into four subblocks SB00, SB01, SB02 and SB03, the block BK1 is divided into four subblocks SB10, SB11, SB12 and SB13, the block BK2 is divided into four subblocks SB20, SB21, SB22 and SB23, and the block BK3 is divided into four subblocks SB30, SB31, SB32 and SB33.

Comparison data d[0] to d[576] are divided into four parts and are input to each subblock on a 144-bit unit. In other words, data d[0] to d[143] are input to the subblocks SB00, SB10, SB20 and SB30, data d[144] to d[287] are input to the subblocks SB01, SB11, SB21 and SB31, data d[288] to d[431] are input to the subblocks SB02, SB12, SB22 and SB32, and data d[432] to d[575] are input to the subblocks SB03, SB13, SB23 and SB33. The data d[0] to d[143] are exactly input to the subblocks SB00, SB10, SB20 and SB30, the data are input to the subblocks SB01, SB11, SB21 and SB31 via the latch circuit LC in one stage, the data are input to the subblocks SB02, SB12, SB22 and SB32 via the latch circuit LC in two stages, and the data are input to the subblocks SB03, SB13, SB23 and SB33 via the latch circuit LC in three stages.

Figure 17:
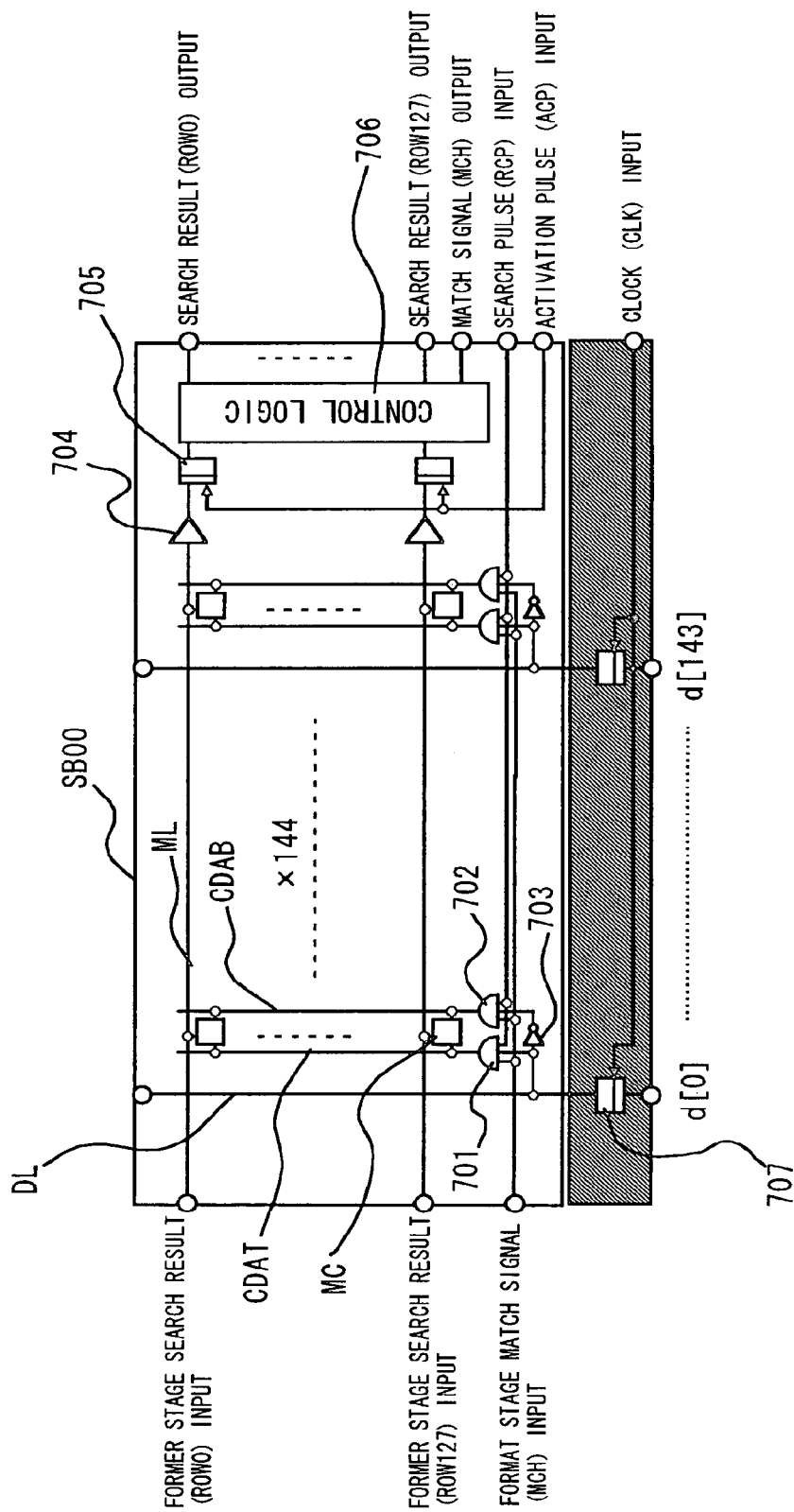
FIG. 17 is a circuit diagram showing an example of the structure of a subblock in the CAM macro cell array.

FIG. 17 shows an example of the structure of SB00 to be one of the subblocks.

The subblock SB00 is not particularly restricted but includes 144 sets of comparison data line pairs CDAT and CDAB provided corresponding to the input data d[0] to d[143], 128 match signal lines ML provided to cross them, a memory cell MC provided in the cross portion of the comparison data line pair CDAT and CDAB and the match signal lines, a buffer 704 provided corresponding to the 128 match signal lines ML, a plurality of latch circuits 705 capable of latching the output signal of the buffer 704 based on an activating pulse signal, and a control logic 706 capable of supplying, to the subblock SB01 in a latter stage, a match signal MCH which can decide whether or not the input data are matched with entry data and row system search results ROW0 to ROW127 based on the output signals of the latch circuits 705. 144 data lines DL are provided corresponding to the input data d[0] to d[143]. A latch circuit 707 is coupled to the input data d[0] to d[143]. 3-input AND gates 701 and 702 are coupled to the comparison data line pair CDAT and CDAB, respectively. The data are input to the data lines DL through the corresponding latch circuit 707. The input data are transmitted to the corresponding AND gate 701, and furthermore, are logically inverted by a corresponding inverter 703 and are then transmitted to the corresponding AND gate 702. In the AND gate 701, the AND logic of the match signal MCH, the search pulse RCP and the input data d [0] which are transmitted from the former stage is obtained and is transmitted to the comparison data line CDAT. In the AND gate 702, moreover, the AND logic of the match signal MCH, the search pulse RCP and the output signal of the inverter 703 which are transmitted from the former stage is obtained and is supplied to the comparison data line CDAB. The search pulse RCP and the activating pulse ACP are formed synchronously with the clock signal CK. The data lines DL are coupled to the subblock SB10 in the block BK1 of the latter stage and the data d[0] to d[143] can be supplied to a plurality of subblocks through the corresponding data lines DL.

Figure 18:
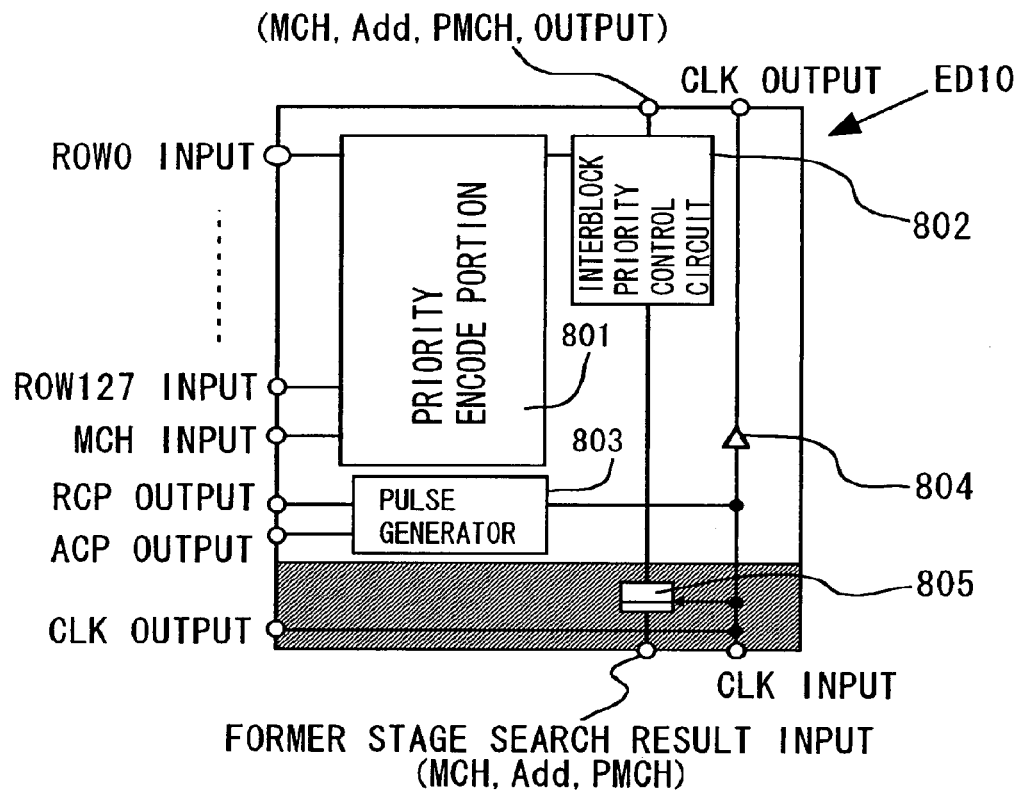
FIG. 18 is a block diagram showing an example of the structure of an encoder portion included in the LSI for a CAM.

FIG. 18 shows an example of the structure of the encoder portion ED10.

The encoder portion ED10 is not particularly restricted but includes a priority encode portion 801, a pulse generator circuit 803, an interblock priority control circuit 802, a buffer 804 and a latch circuit 805.

The priority encode portion 801 outputs the match signal MCH in the block BK1, a match address Add thereof, and a multiple match signal PMCH indicative of a multiple match based on the search results (the comparison results of the comparison data and the entry data) ROW0 to ROW127 and the match signal MCH in the subblocks SB00 to SB03.

The pulse generator circuit 803 forms the search pulse signal RCP and the activating pulse signal ACP synchronously with the clock signal CLK. Moreover, the latch circuit 805 fetches a detection result (the match signal MCH, the match address signal Add and the multiple match signal PMCH) sent from the block BK0 in the former stage synchronously with the clock signal CLK and transmits the same detection result to the interblock priority control circuit 802. The clock signal CLK is transmitted through the buffer 804 to the encoder portion ED20 in the block BK2 of the latter stage.

The other encoder portions ED00, ED20 and ED30 are also constituted in the same manner as the encoder portion ED10.

Figure 19:
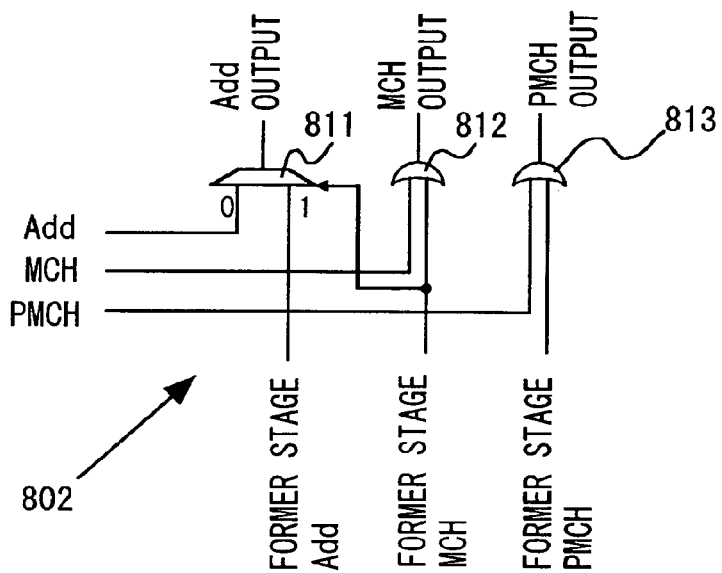
FIG. 19 is a circuit diagram showing an example of the structure of an interblock priority control circuit included in the encoder portion.

FIG. 19 shows an example of the structure of the interblock priority control circuit 802.

The interblock priority control circuit 802 is not particularly restricted but includes a selector 811 and OR gates 812 and 813. The selector 811 selectively outputs, to the block (BK2) in the latter stage, the match address transmitted from the block (BK0) in the former stage and the match address Add sent from the encoder portion ED10 in the block BK1. The OR gate 812 takes the OR logic of the multiple match signal MCH transmitted from the block in the former stage and the multiple match signal PMCH transmitted from the encoder portion ED10 in the block BK1 and outputs the same OR logic to the block (BK2) in the latter stage. When the match signal MCH sent from the block in the former stage has a high level (active), the match address signal transmitted from the block in the former stage by the selector 811 is selectively output to the block in the latter stage.

Figure 20:
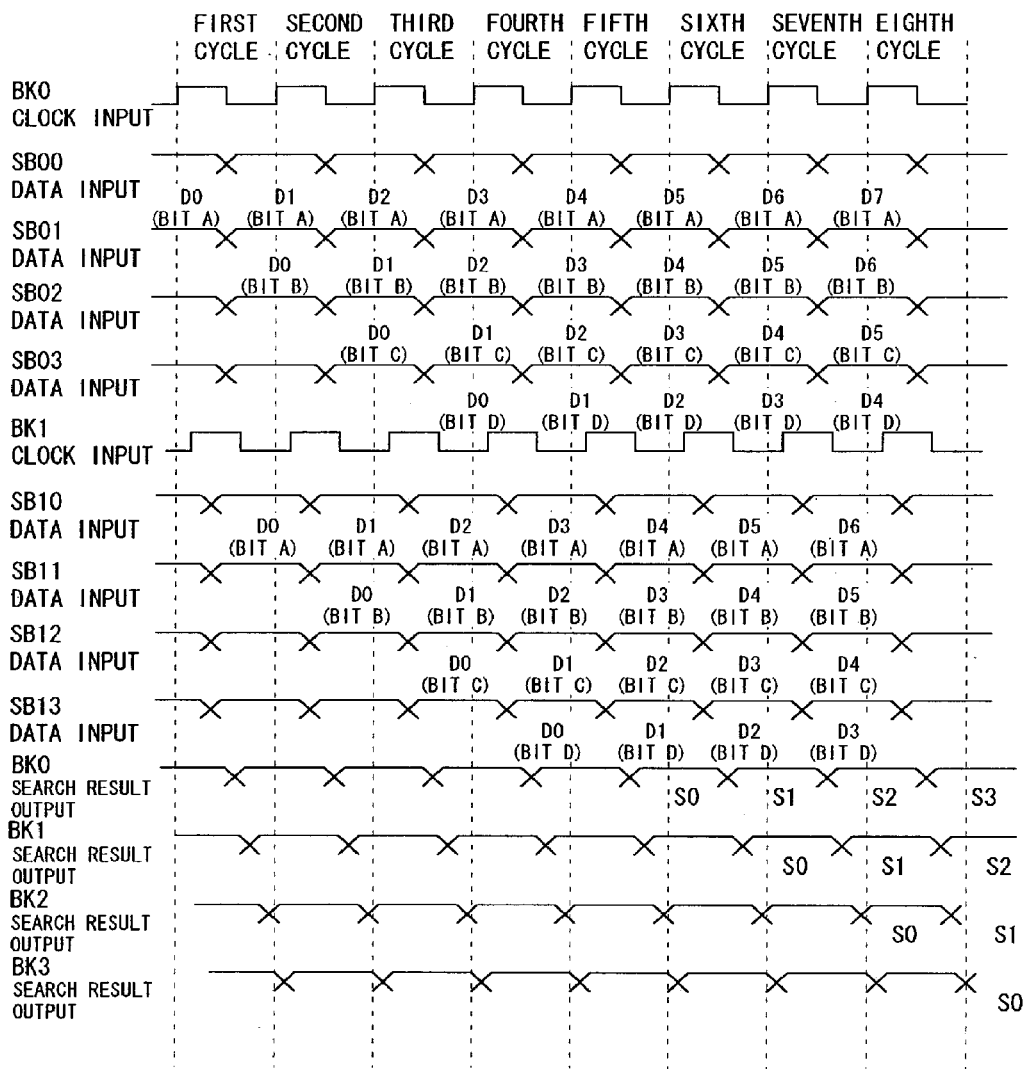
FIG. 20 is a timing chart showing a search operation in the CAM macro cell array.
Figure 21:
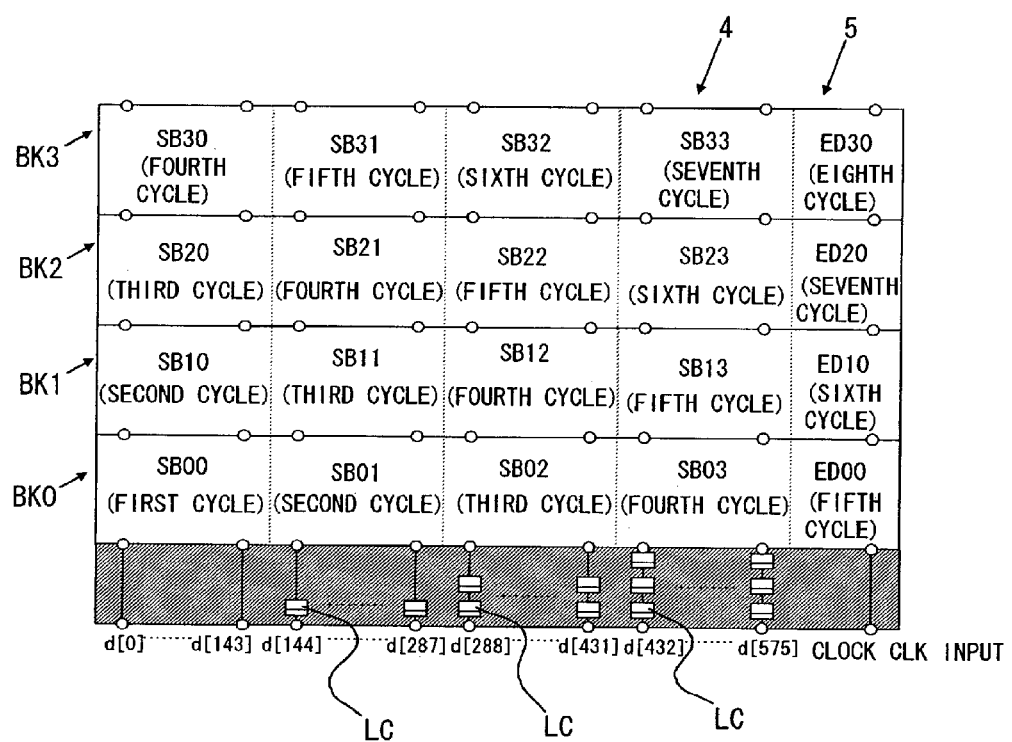
FIG. 21 is an explanatory diagram showing the order of an operation in the CAM macro cell array.

FIG. 20 shows the timing of a search operation in the CAM macro cell array 4. FIG. 21 shows the order of the search operation in the CAM macro cell array 4. In FIG. 20, a bit A implies a bit of [0:143], a bit B implies a bit of [144:287], a bit C implies a bit of [288:431], and a bit D implies a bit of [432:575].

In the structure described above, comparison data input for a search are fetched to the block BK0 through the latch circuit 707 to be operated synchronously with the clock signal CLK and are compared with entry data. Then, the comparison data are transmitted to a next block. 144 bits in the 576 bits are searched in the first subblock SB00 (a comparing operation). If match data are not present, the comparing operation is not carried out in the subsequent subblocks SB01, SB02 and SB03. On the other hand, referring to the comparison, next 144 bits are compared in the next subblock SB01 in a subsequent cycle if the match data are present. Thus, the pipeline processing is sequentially carried out synchronously with the clock signal CLK.

On the other hand, the comparing operation is executed after one cycle by using a search result transferred from the block BK0 also in the block BK1. A search result obtained in each of the blocks is transferred to the corresponding encoder portions ED00 to ED30, and a match address is calculated and is output together with a match signal. At this time, if the match data are present in the block of the former stage, the match address output from the block in the former stage is output preferentially by the selecting operation of the selector 811. Each of the blocks has an input terminal provided on a lower side thereof and an output terminal provided on an upper side thereof. When the number of entries is set to be 512, four blocks are arranged in a vertical direction so that a CAM macro cell having a 512-entry by 576-bit structure is implemented. Referring to the CAM macro cell array 4 in the example, search data are divided in a transverse direction (a direction of an arrow X in FIG. 16) and an entry is divided in a vertical direction (a direction of an arrow Y in FIG. 16), and they are pipeline operated synchronously with the clock signal CLK, respectively. Thus, the pipeline operation is carried out synchronously with the clock signal CLK. Therefore, it is possible to enhance a search throughput in the CAM macro cell array 4. In addition to such an enhancement in the search throughput, furthermore, the comparing operation is not carried out in a subsequent subblock if the match data are not present. Therefore, it is possible to reduce a consumed power in the CAM macro cell array 4 in the same manner as in the structures shown in FIGS. 4 and 6. Moreover, it is possible to easily increase the number of the entries in the vertical direction (in the direction of the arrow Y) while maintaining the search throughput.

In the case in which one data having a 576-bit structure are to be searched as shown in FIG. 21, the subblock SB00 is searched in a first cycle and the subblock SB01 and the subblock SB10 are searched in a next cycle (a second cycle). In a subsequent cycle, the subblock SB02, the subblock SB11 and the subblock SB20 are searched. In the example, a whole search result is output after 8 cycles. When this is pipeline operated, a part of divided bits in the same input data or a different entry is searched in a subblock in an nth cycle. Moreover, input data are delayed corresponding to a transfer delay between the blocks and are thus sent to a closer block to an output side. However, the clock signal CLK is also delayed corresponding to the transfer delay between the blocks. For this reason, their relative relationship is not changed. If a timing design is carried out in one block, therefore, a timing on an input terminal in each of the blocks is identical between the blocks irrespective of a structure in which the blocks are arranged. Consequently, it is possible to easily expand the entry.

Figure 22:
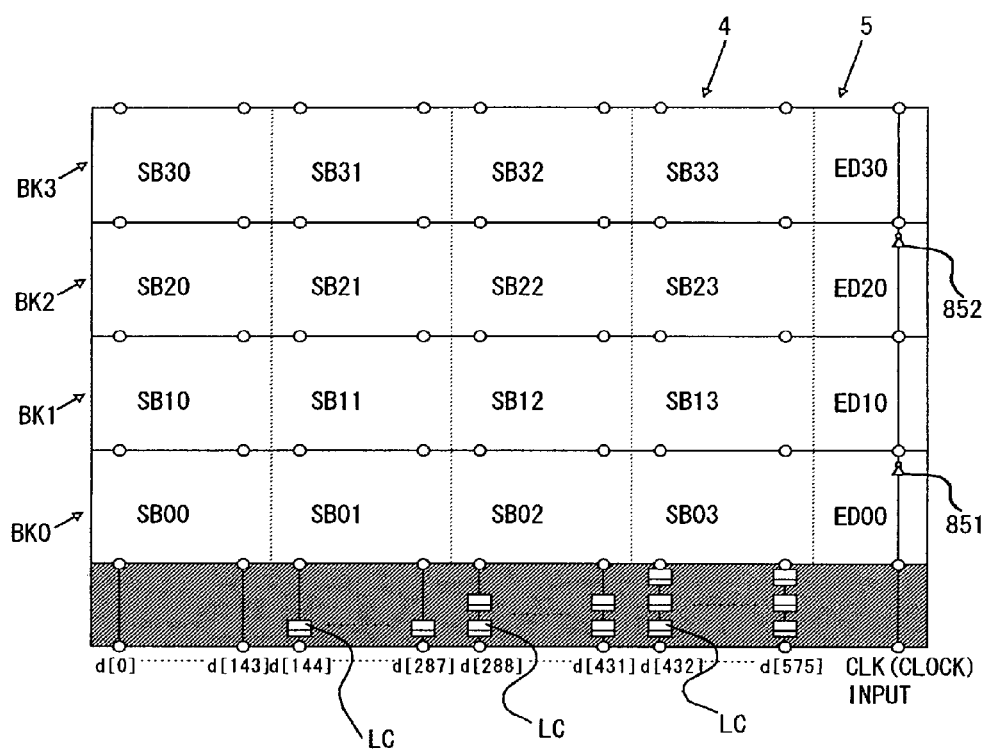
FIG. 22 is an explanatory diagram showing another example of the structure of the CAM macro cell array.
Figure 23:
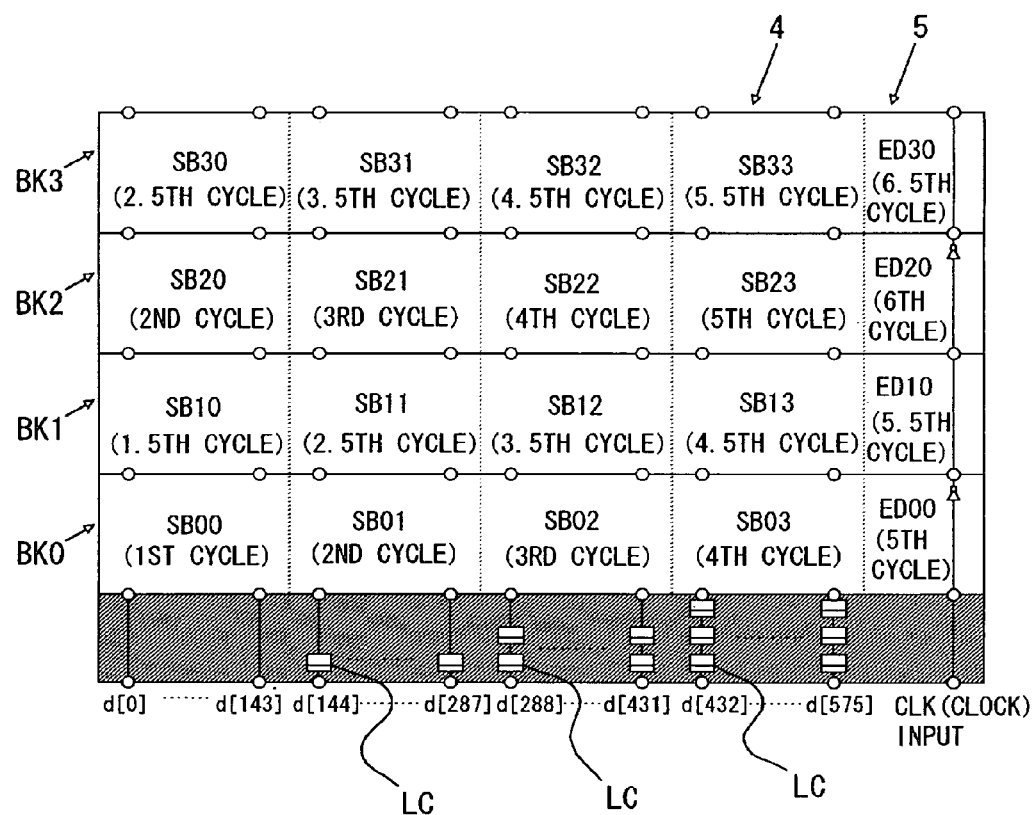
FIG. 23 is an explanatory diagram showing the order of an operation in the CAM macro cell array illustrated in FIG. 22.
Figure 24:
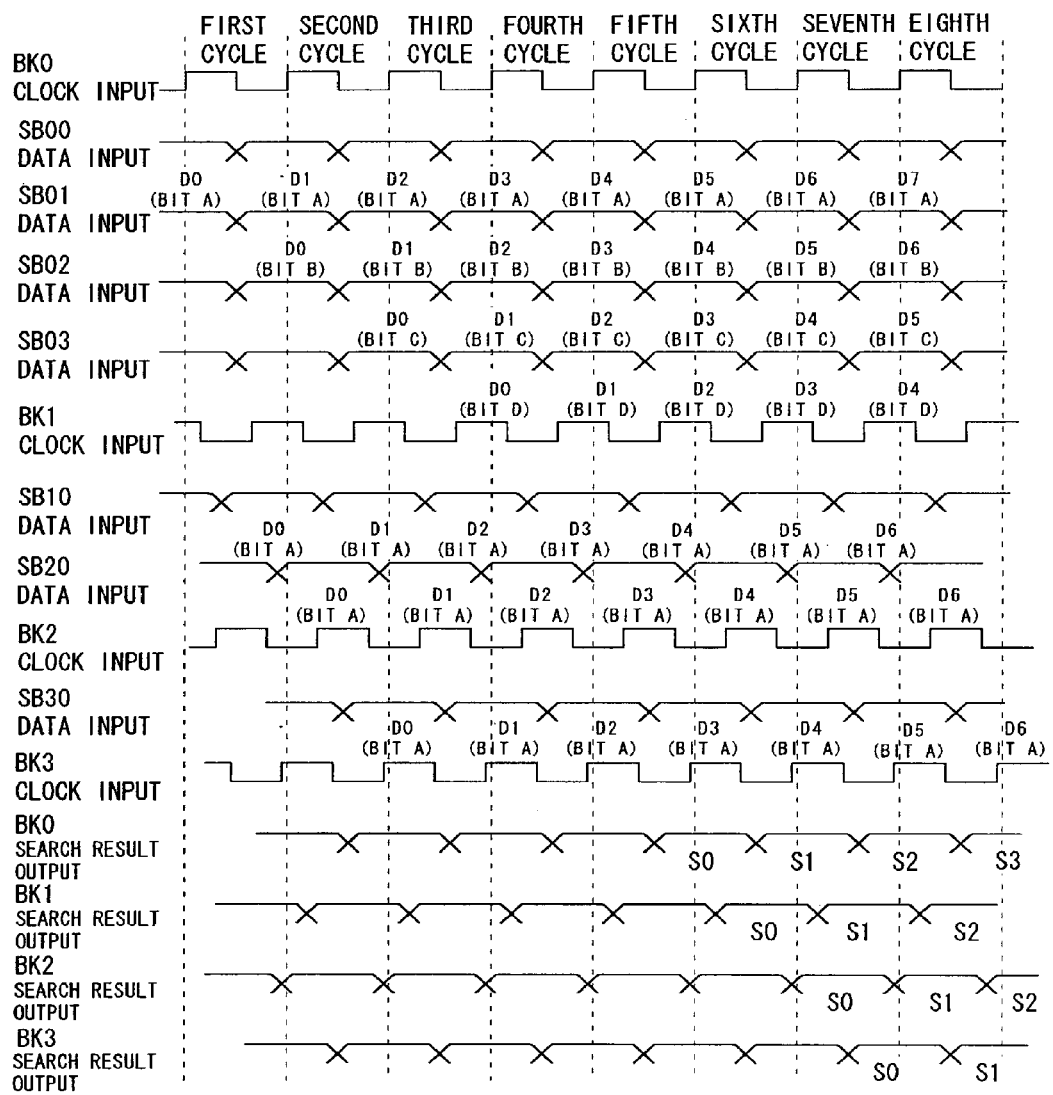
FIG. 24 is an operation timing chart for the CAM macro cell array illustrated in FIG. 22.

As another example of the structure in the CAM macro cell array 4, moreover, the blocks may be pipeline operated alternately and synchronously with the leading and trailing edges of a clock in a structure constituted by the blocks. FIG. 22 shows an example of the structure of the CAM macro cell array 4 in that case. Inverters 851 and 852 capable of inverting the logic of clock signals input to the block BK1 and the block BK3 are provided, and the block BK1 and the block BK3 are operated synchronously with the trailing edge of the clock signal CLK. FIG. 23 shows the order of an operation in this case, and FIG. 24 shows an operation timing in that case. In FIG. 24, a bit A implies a bit of [0:143], a bit B implies a bit of [144:287], a bit C implies a bit of [288:431], and a bit D implies a bit of [432:575]. In the block BK1, the subblock SB10 is operated in a 1.5th cycle, the subblock SB11 is operated in a 2.5th cycle, the subblock SB12 is operated in a 3.5th cycle, the subblock SB13 is operated in a 4.5th cycle, and the encoder portion ED10 is operated in a 5.5th cycle. In the block BK3, moreover, the subblock SB30 is operated in a 2.5th cycle, the subblock SB31 is operated in a 3.5th cycle, the subblock SB32 is operated in a 4.5th cycle, the subblock SB33 is operated in a 5.5th cycle, and the encoder portion ED30 is operated in a 6.5th cycle. Such an operation can be carried out when a transfer time between the blocks is short, and a latency can be shortened. Referring to an operating current, moreover, a timing for a peak in the cycle can be distributed. Therefore, a fluctuation in a power supply can be reduced.

Figure 25:
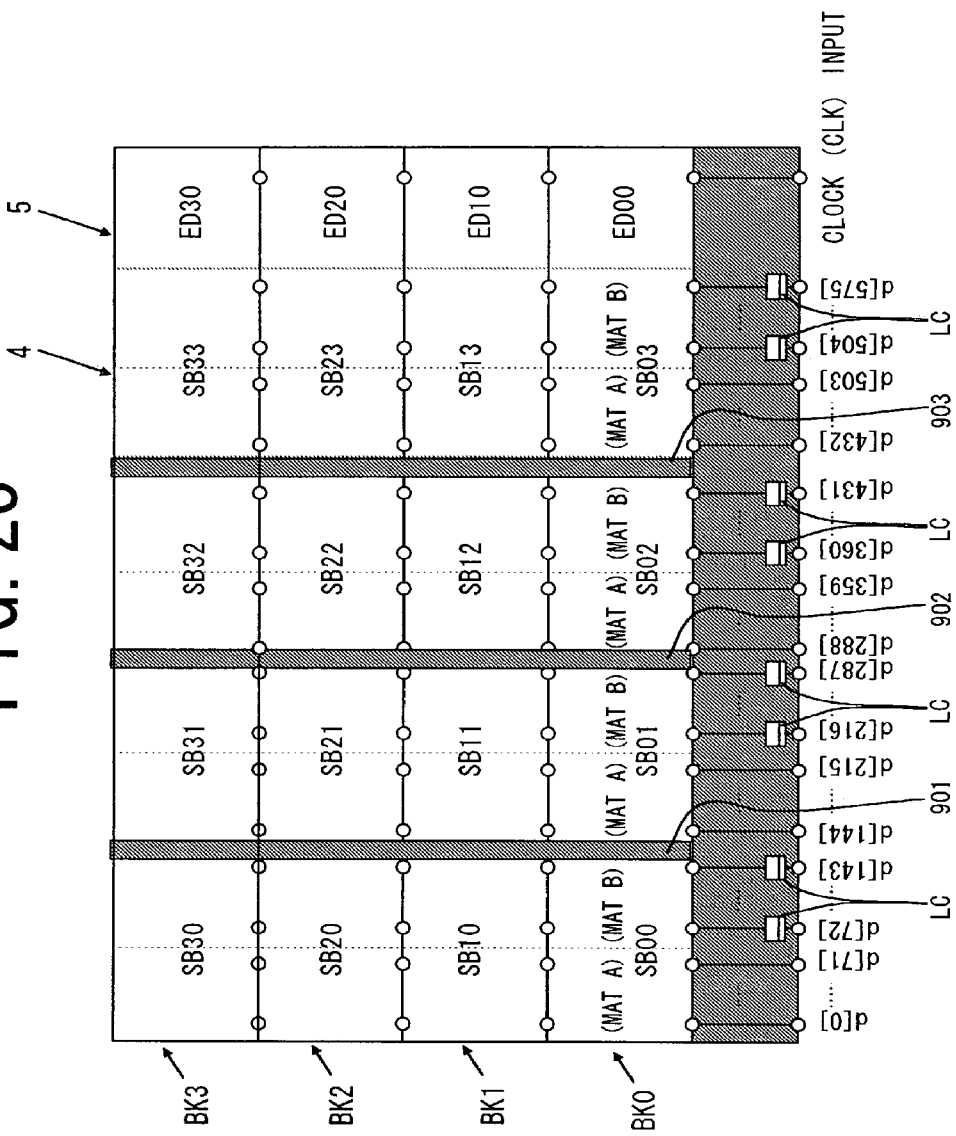
FIG. 25 is an explanatory diagram showing another example of the structure of the CAM macro cell array.
Figure 26:
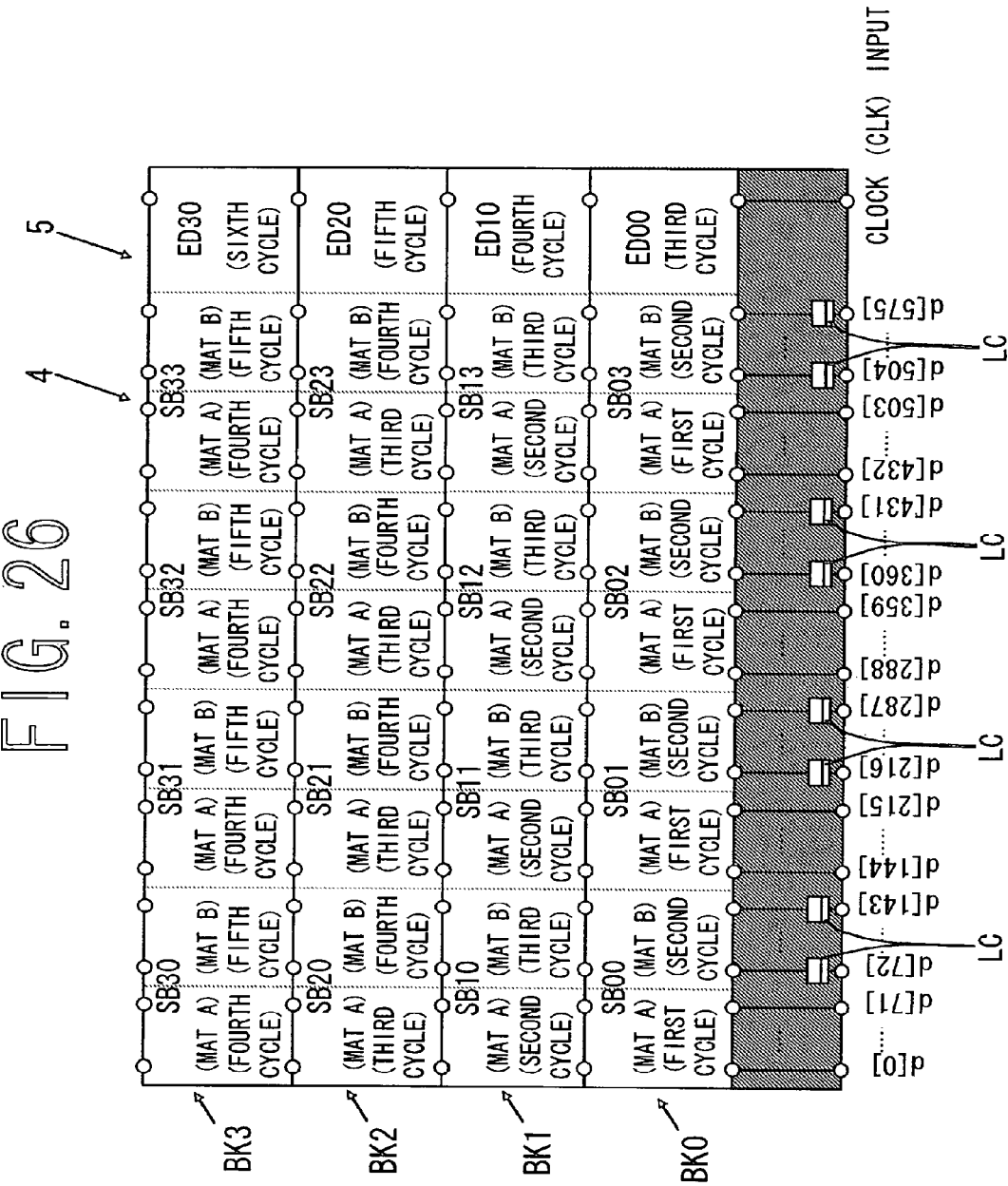
FIG. 26 is an explanatory diagram showing the order of an operation in the CAM macro cell array illustrated in FIG. 25.

In a division in the direction of search data, furthermore, the subblock may be divided into a plurality of mats. FIG. 25 shows an example of the structure of the CAM macro cell array 4 in this case.

In the example of the structure shown in FIG. 25, each of the subblocks is divided into two parts including a block A and a block B. In each of the subblocks, data input to the block A do not pass through the latch circuit, while data input to the block B pass through the latch circuit LC to be operated synchronously with the clock signal CLK by only one stage. For this reason, the data are input to the block A and the block B in each of the subblocks with a shift of one cycle.

Figure 27:
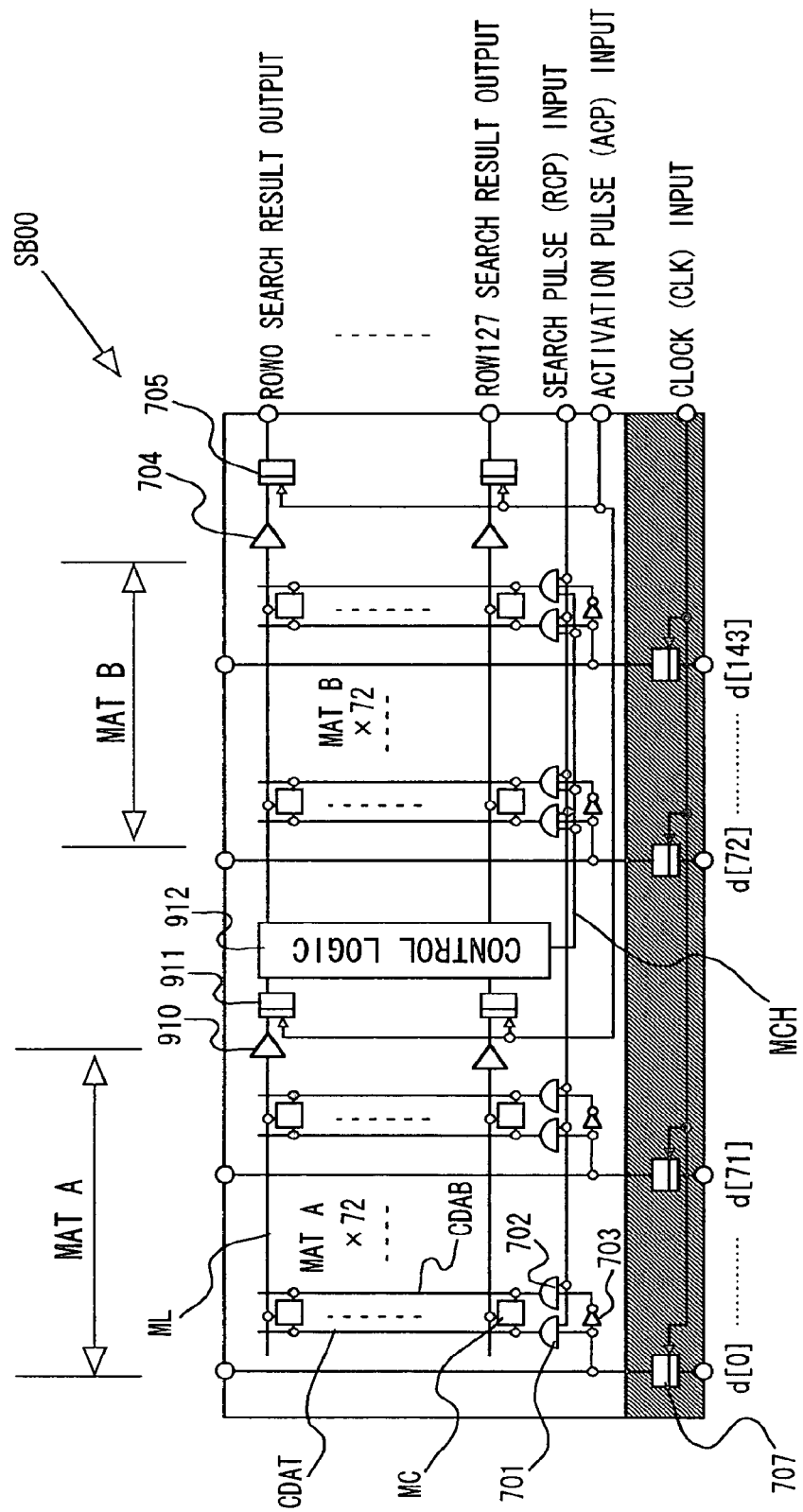
FIG. 27 is a circuit diagram showing an example of the structure of a subblock in the CAM macro cell array illustrated in FIG. 25.

FIG. 27 shows an example of the structure of the subblock SB00. As shown in FIG. 27, the subblock SB00 is provided with a control logic 912 between a mat A and a mat B, and the signals of a plurality of match signal lines ML in the mat A are transmitted to the control logic 912 through a buffer 910 and a latch circuit 911 which correspond respectively. The latch circuit 911 is operated synchronously with an activating pulse (ACP). The function of the control logic 912 is set to be basically identical to that of the control logic 706 in FIG. 17 and decides whether or not input data and entry data are matched with each other based on the logic of the match signal lines ML in the mat A. A match signal output from the control logic 912 is supplied to one of the input terminals of a 3-input AND gate in the mat B. When the data are mismatched in the mat A, a comparison in the mat B is prohibited so that a consumed power can be reduced. The other subblocks are also constituted in the same manner as the subblock SB00 shown in FIG. 27.

An intersubblock search result totaling logic portion 901 is provided between the subblocks SB00, SB10, SB20 and SB30 and the subblocks SB01, SB11, SB21 and SB31, an intersubblock search result totaling logic portion 902 is provided between the subblocks SB01, SB11, SB21 and SB31 and the subblocks SB02, SB12, SB22 and SB32, and an intersubblock search result totaling logic portion 903 is provided between the subblocks SB02, SB12, SB22 and SB32 and the subblocks SB03, SB13, SB23 and SB33. The intersubblock search result totaling logic portions 901 to 903 obtain the AND logic of the corresponding intersubblock search results.

Figure 28:
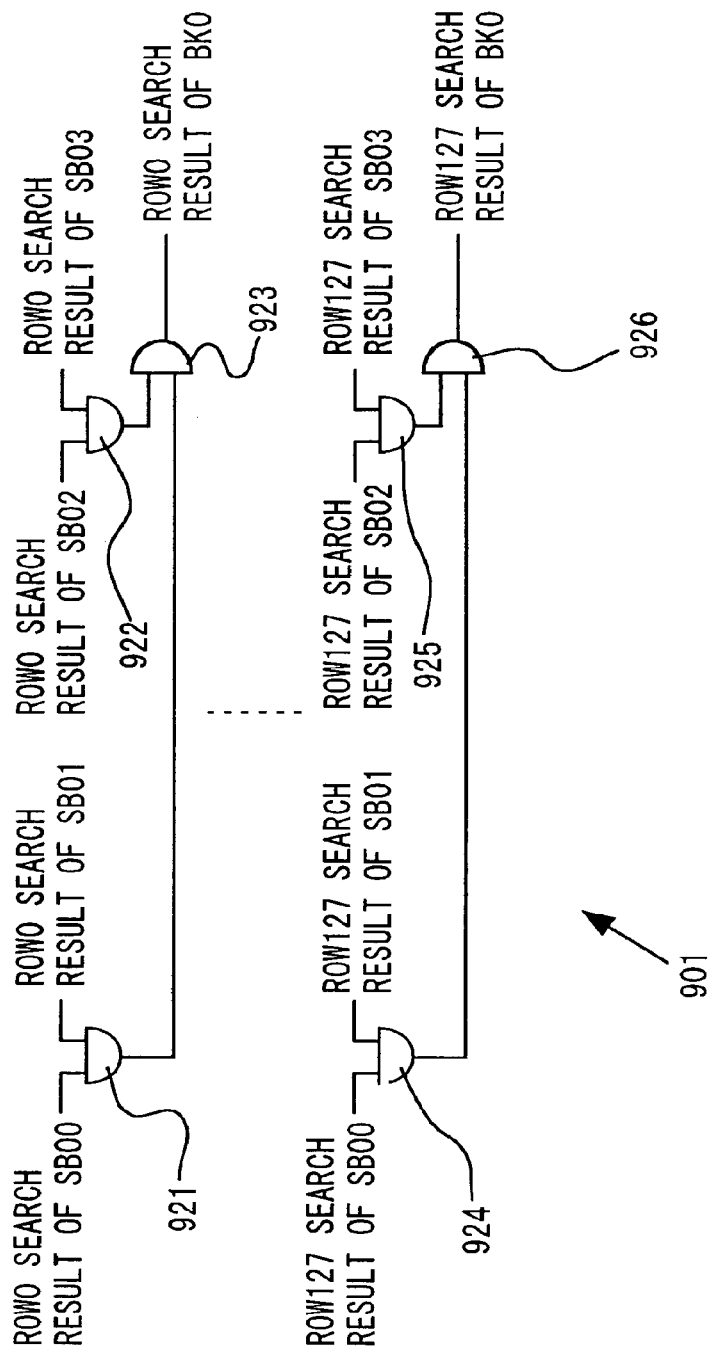
FIG. 28 is a circuit diagram showing an example of the structure of an intersubblock search result totaling logic portion in the CAM macro cell array illustrated in FIG. 25.

FIG. 28 shows an example of the structure of the intersubblock search result totaling logic portion 901. As shown in FIG. 28, the intersubblock search result totaling logic portion 901 is constituted to include a plurality of 2-input, AND gates for logically synthesizing the search results of the subblocks. For example, an AND gate 921 obtains the AND logic of the ROW0 search result of the subblock SB00 and the ROW0 search result of the subblock SB01. An AND gate 922 obtains the AND logic of the ROW0 search result of the subblock SB02 and the ROW0 search result of the subblock SB03. An AND gate 923 obtains the AND logic of the AND gate 921 and the AND gate 922. The output signal of the AND gate 923 is set to be the ROW0 search result in the block BK0. Moreover, an AND gate 924 obtains the AND logic of the ROW127 search result of the subblock SB00 and the ROW127 search result of the subblock SB01. An AND gate 925 obtains the AND logic of the ROW127 search result of the subblock SB02 and the ROW127 search result of the subblock SB03. An AND gate 926 obtains the AND logic of the AND gate 924 and the AND gate 925. The output signal of the AND gate 926 is set to be the ROW127 search result in the block BK0.

Figure 29:
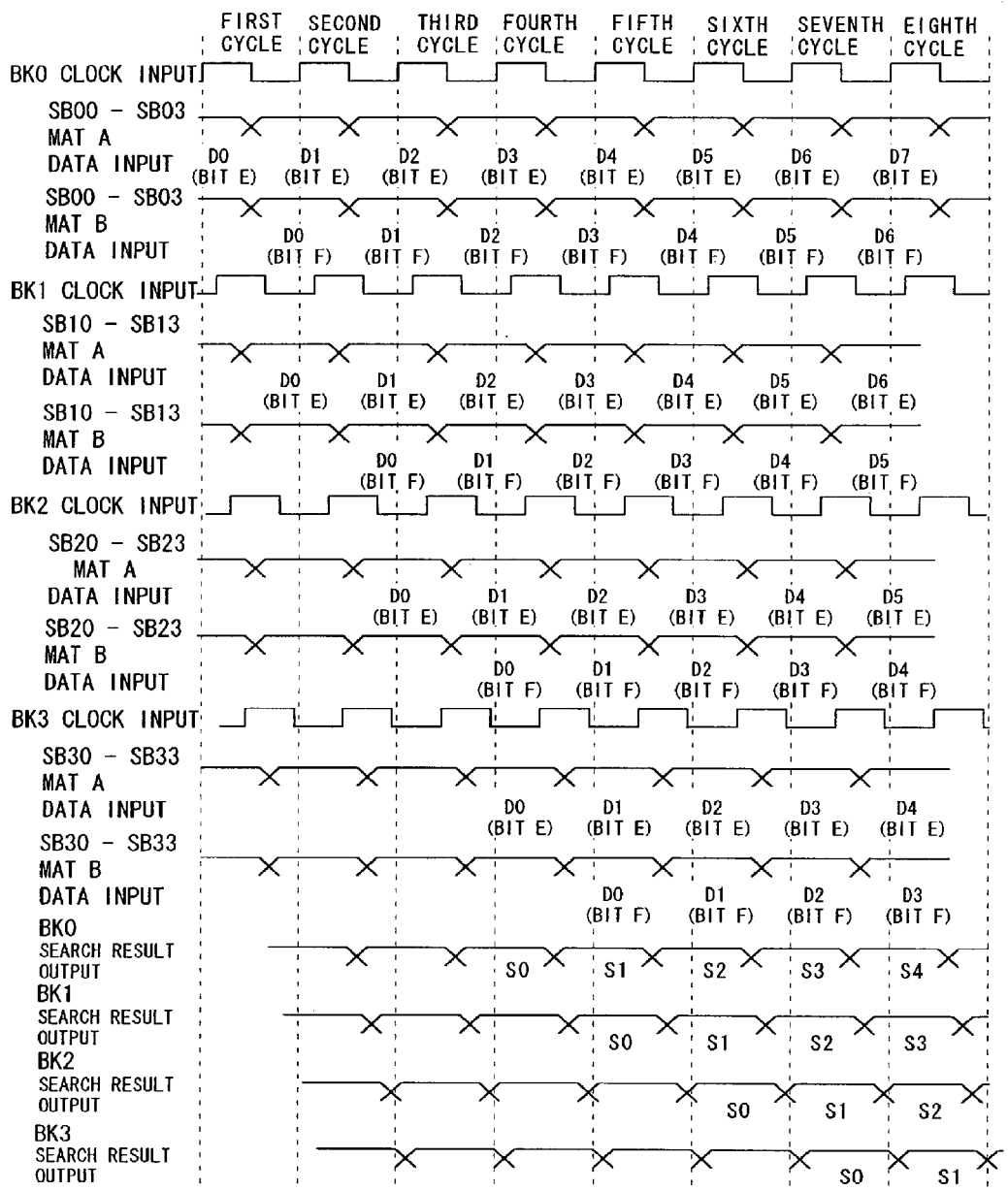
FIG. 29 is an operation timing chart showing a main part in the CAM macro cell array illustrated in FIG. 25.

FIG. 29 shows the operation timing of a main part in the structure shown in FIG. 25. In FIG. 29, a bit E implies a bit of [0:71], a bit of [144:215], a bit of [288:359] and a bit of [432:503], and a bit F implies a bit of [72:143], a bit of [216:287], a bit of [360:431] and a bit of [504:575].

In the structure described above, a processing in the direction of search data is set to be a pipeline processing in each of a plurality of subblocks obtained by a division. Referring to a search result in each of the subblocks, an AND logic is taken in the intersubblock search result totaling logic portion and it is decided whether or not 576-bit data are matched with entry data. A mat A in each of the subblocks of the first block BK0 is searched, and a mat B is not searched if match data are not present. If the match data are present, the mat B is searched in a next cycle. The direction of an entry is the same as that in the example and is different from that in the example in that the pipeline operation is carried out for each block with a shift of one cycle.

It is also possible to carry out a synchronization with the leading and trailing edges of a clock as in the example described above. Consequently, it is possible to reduce the latency of a search operation. In addition, since a search operation area is distributed into the macro, a fluctuation in a power supply can be reduced.

While the above description has been given to the case in which the invention made by the inventor is mainly applied to an LSI for a CAM to be a utilization field which is the background of the invention, the invention is not restricted thereto but can be applied to various LSIs.

The invention can be applied on the condition that at least the comparison of comparison data with entry data is made.

Advantages obtained by the typical invention disclosed in the application will be briefly described below.

More specifically, it is possible to reduce the consumed power of a semiconductor memory device by decreasing the number of signal lines to be activated in one cycle of a comparing operation.

Moreover, it is possible to reduce a fluctuation in a consumed current by always causing a current to flow through a search operation.

Furthermore, a pipeline operation is carried out between a plurality of blocks synchronously with a clock signal and a processing of comparing the bit of a latter stage portion in entry data with the corresponding bit of the comparison data is also pipeline operated synchronously with the clock signal. Consequently, the throughput of a CAM portion can be enhanced. In addition, the number of the signal lines to be activated in one cycle of the comparing operation is decreased as described above. Thus, it is possible to reduce the consumed power of a semiconductor memory device.

What is claimed is:

1. A semiconductor memory device which includes a CAM portion capable of holding entry data, and can compare input comparison data with the entry data and can output a result of the comparison, comprising:
   a controller for generating a search request to the CAM portion,
   the controller including search rate setting means capable of setting a search rate having a level for suppressing a fluctuation in a current.

2. The semiconductor memory device according to claim 1, wherein the controller supplies a power control search enable signal to the CAM portion to generate a dummy search request to the CAM portion so that a search rate of the CAM portion has a predetermined value or more.

3. The semiconductor memory device according to claim 1, wherein the CAM portion comprises a comparison data amplifier which amplifies comparison data and supplies the amplified comparison data to comparison data lines;
   wherein the controller comprises a register, a timing generator, a control logic and a comparing circuit;
   wherein the timing generator supplies a signal to the control logic at a constant ratio synchronously with the clock signal;
   wherein the control logic generates an update value of the register in accordance with a truth table when the control logic receives the signal;
   wherein the comparing circuit sets a search request signal when the value of the register is a predetermined value; and
   wherein the comparison data amplifier is activated based on the search request signal.

4. The semiconductor memory device according to claim 3, wherein a search enable signal based on the search request signal indicates validity of a comparing operation.

5. A semiconductor memory device comprising,
   a CAM macro cell array; and
   a power controller;
   wherein the CAM macro cell array comprises a comparison data amplifier which amplifies comparison data and supplies the comparison data to comparison data lines;
   wherein the power controller comprises a register, a timing generator, a control logic and a comparing circuit;
   wherein the timing generator supplies a signal to the control logic at a constant ratio synchronously with the clock signal;
   wherein the control logic generates an update value of the register in accordance with a truth table when the control logic receives the signal;
   wherein the comparing circuit sets a search request signal when the value of the register is a predetermined value; and
   wherein the comparison data amplifier is activated based on the search request signal.

6. The semiconductor memory device according to claim 5, wherein a search enable signal based on the search request signal indicates validity of a comparing operation.

7. A semiconductor memory device which includes a CAM portion capable of holding entry data, and can compare input comparison data with the entry data and can output a result of the comparison, comprising:
   a controller for generating a search request to the CAM portion,
   the controller being operable to set a search rate having a level for suppressing a fluctuation in a current.

8. The semiconductor memory device according to claim 7, wherein the controller supplies a power control search enable signal to the CAM portion to generate a dummy search request to the CAM portion so that a search rate of the CAM portion has a predetermined value or more.

9. The semiconductor memory device according to claim 7, wherein the CAM portion comprises a comparison data amplifier which amplifies comparison data and supplies the amplified comparison data to comparison data lines;
   wherein the controller comprises a register, a timing generator, a control logic and a comparing circuit;
   wherein the timing generator supplies a signal to the control logic at a constant ratio synchronously with the clock signal;
   wherein the control logic generates an update value of the register in accordance with a truth table when the control logic receives the signal;
   wherein the comparing circuit sets a search request signal when the value of the register is a predetermined value; and
   wherein the comparison data amplifier is activated based on the search request signal.

10. The semiconductor memory device according to claim 9, wherein a search enable signal based on the search request signal indicates validity of a comparing operation.

* * * * *